(12) United States Patent
Nakamura et al.

(10) Patent No.: US 9,472,489 B2
(45) Date of Patent: Oct. 18, 2016

(54) HEAT EXCHANGER

(75) Inventors: Masaya Nakamura, Kariya (JP); Naoki Sugimoto, Anjo (JP); Takao Ikeda, Okazaki (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 1207 days.

(21) Appl. No.: 13/368,735

(22) Filed: Feb. 8, 2012

(65) Prior Publication Data

US 2012/0205086 A1 Aug. 16, 2012

(30) Foreign Application Priority Data

Feb. 14, 2011 (JP) ................................. 2011-028682
Feb. 14, 2011 (JP) ................................. 2011-028683

(51) Int. Cl.
*H01L 23/473* (2006.01)
*F28F 3/02* (2006.01)
*F28F 3/08* (2006.01)
(Continued)

(52) U.S. Cl.
CPC ............. *H01L 23/473* (2013.01); *F28F 3/025* (2013.01); *F28F 3/08* (2013.01); *H01L 23/40* (2013.01); *H01L 23/4012* (2013.01); *F28D 2021/0028* (2013.01); *H01L 25/112* (2013.01); *H01L 2924/0002* (2013.01)

(58) Field of Classification Search
CPC ........ F28F 1/40; F28F 2215/04; F28F 1/022; F28F 3/025; F28F 3/08; H01L 23/473; H01L 23/40; H01L 23/4012; H01L 25/112; H01L 2924/0002; H01L 2924/00; F28D 2021/0028

USPC .................................................. 165/181, 182
See application file for complete search history.

(56) References Cited

U.S. PATENT DOCUMENTS 2,526,135 A * 10/1950 Holmes ................. F28D 9/0031
165/153
2,576,213 A * 11/1951 Chausson ............. F28D 9/0025
165/157

(Continued)

FOREIGN PATENT DOCUMENTS

EP      1 414 245      4/2004
JP      07-280484      10/1995

(Continued)

OTHER PUBLICATIONS

Office action dated Feb. 24, 2014 in corresponding Chinese Application No. 2012 10027377.7.

(Continued)

*Primary Examiner* — Tho V Duong
*Assistant Examiner* — Raheena Rehman
(74) *Attorney, Agent, or Firm* — Harness, Dickey & Pierce, P.L.C.

(57) ABSTRACT

An inner fin is provided in a fluid pipe for dividing a fluid passage for heating medium into multiple small fluid passages, so as to facilitate heat exchange between the heating medium and an electronic part. The inner fin is formed in a wave shape in a cross section perpendicular to a flow direction of the heating medium, wherein the inner fin has projecting portions alternately projecting in one direction and in the other direction. The inner fin is composed of multiple fin portions, wherein a fin pitch of a first fin portion is made to be smaller than a fin pitch of a second fin portion, which faces to the electronic part.

10 Claims, 12 Drawing Sheets

(51) Int. Cl.
H01L 23/40 (2006.01)
*H01L 25/11* (2006.01)
*F28D 21/00* (2006.01)

(56) References Cited

U.S. PATENT DOCUMENTS

| | | | | |
|---|---|---|---|---|
| 2,703,921 | A * | 3/1955 | Brown, Jr. | 29/890.036 |
| 3,267,559 | A * | 8/1966 | Laux | 29/890.01 |
| 3,818,984 | A * | 6/1974 | Nakamura | F28D 9/0018 |
| | | | | 165/157 |
| 4,059,882 | A * | 11/1977 | Wunder | 29/890.036 |
| 4,096,616 | A * | 6/1978 | Coffinberry | 29/890.036 |
| 4,527,622 | A * | 7/1985 | Weber | F28D 9/0018 |
| | | | | 165/166 |
| 4,645,000 | A * | 2/1987 | Scarselletta | 165/152 |
| 6,438,936 | B1 * | 8/2002 | Ryan | 60/39.511 |
| 2003/0178189 | A1 * | 9/2003 | Yoshida | B01D 53/62 |
| | | | | 165/166 |
| 2005/0121173 | A1 | 6/2005 | Inagaki et al. | |
| 2005/0257921 | A1 * | 11/2005 | Hu | 165/140 |
| 2007/0039717 | A1 * | 2/2007 | Inagaki | H01L 23/473 |
| | | | | 165/80.4 |
| 2007/0162768 | A1 * | 7/2007 | Bink et al. | 713/194 |
| 2009/0065178 | A1 | 3/2009 | Kasezawa et al. | |
| 2010/0108042 | A1 * | 5/2010 | Akiyoshi | B23K 1/0012 |
| | | | | 123/568.12 |
| 2010/0181058 | A1 * | 7/2010 | Huazhao et al. | 165/173 |
| 2011/0240270 | A1 * | 10/2011 | Hisanaga | F28D 7/1684 |
| | | | | 165/151 |

FOREIGN PATENT DOCUMENTS

| | | |
|---|---|---|
| JP | 2005-191527 | 7/2005 |
| JP | 2010-010418 | 1/2010 |
| JP | 2010-245158 | 10/2010 |
| JP | 2012-164874 | 8/2012 |

OTHER PUBLICATIONS

Office action dated Feb. 12, 2014 in corresponding Japanese Application No. 2011-028683.

* cited by examiner

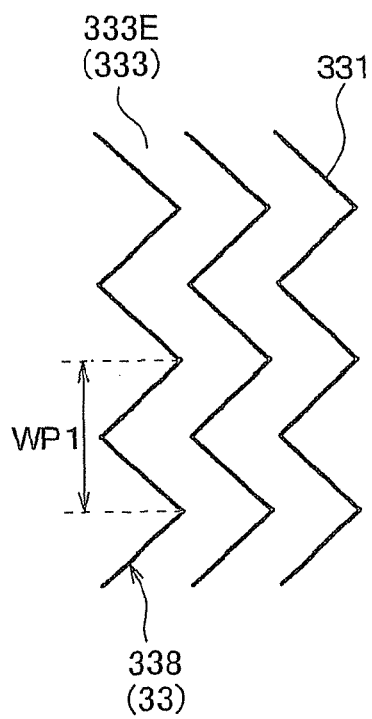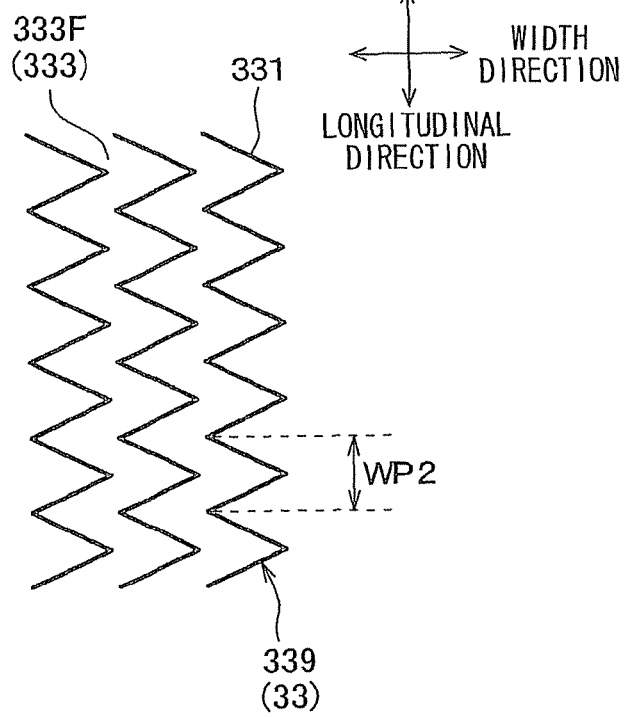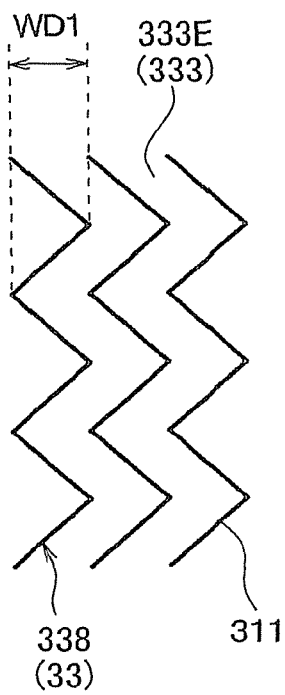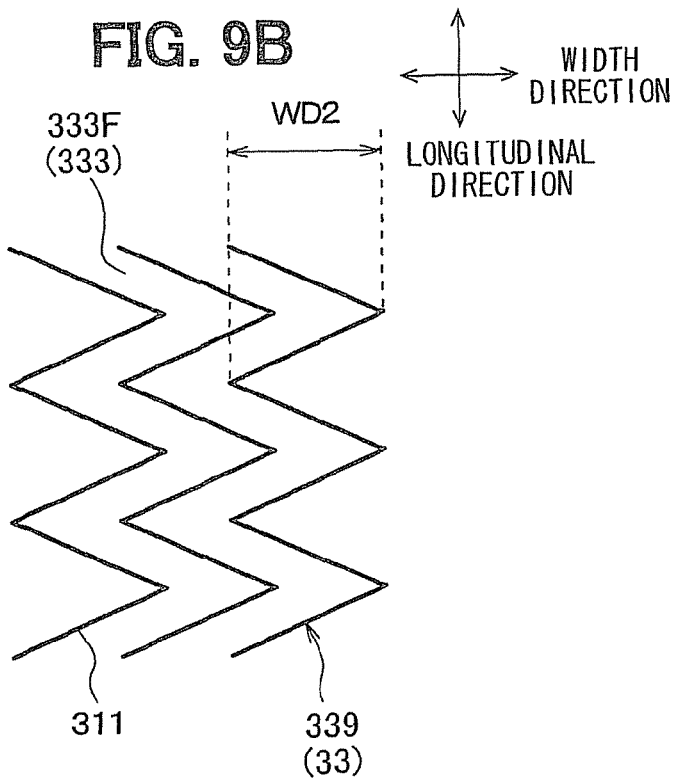

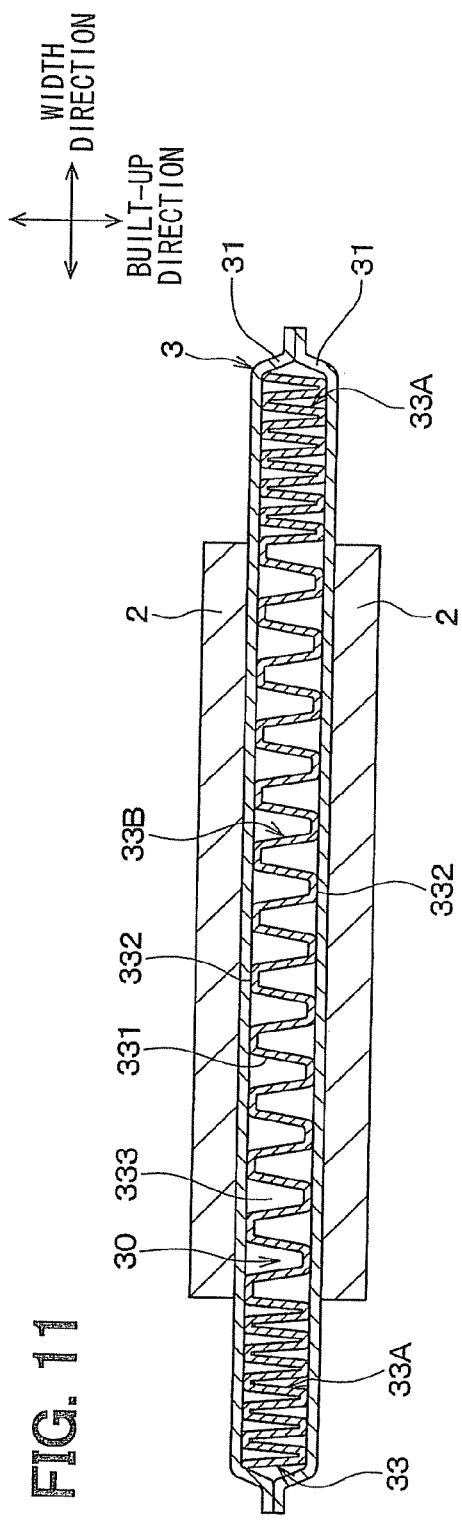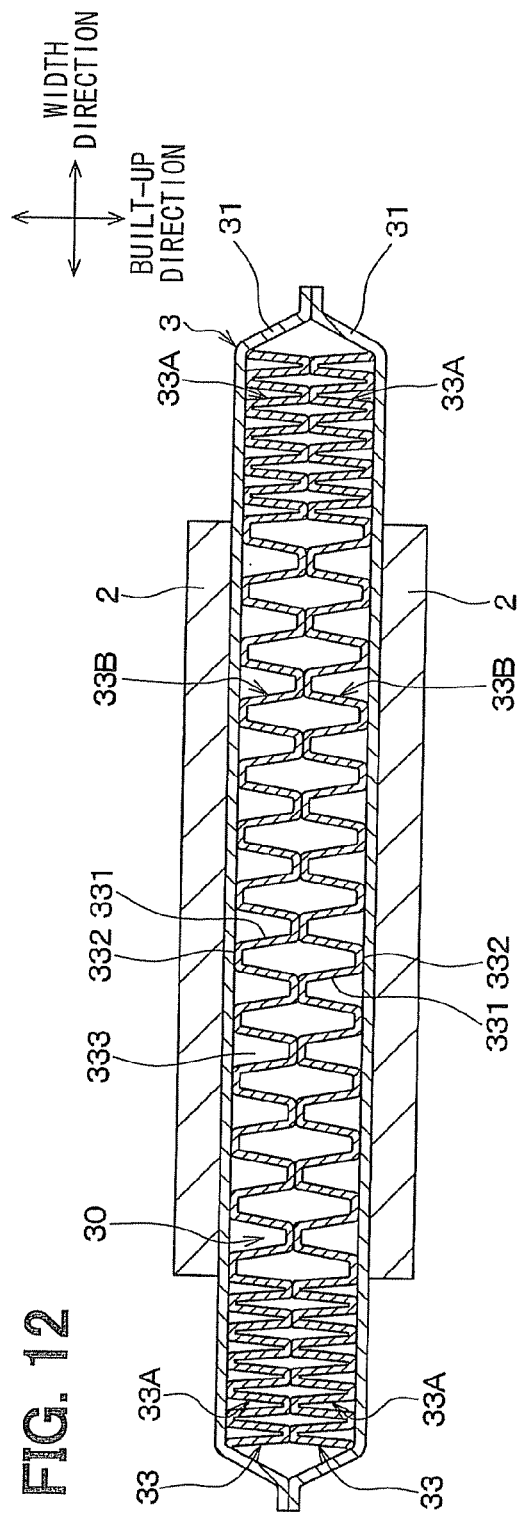

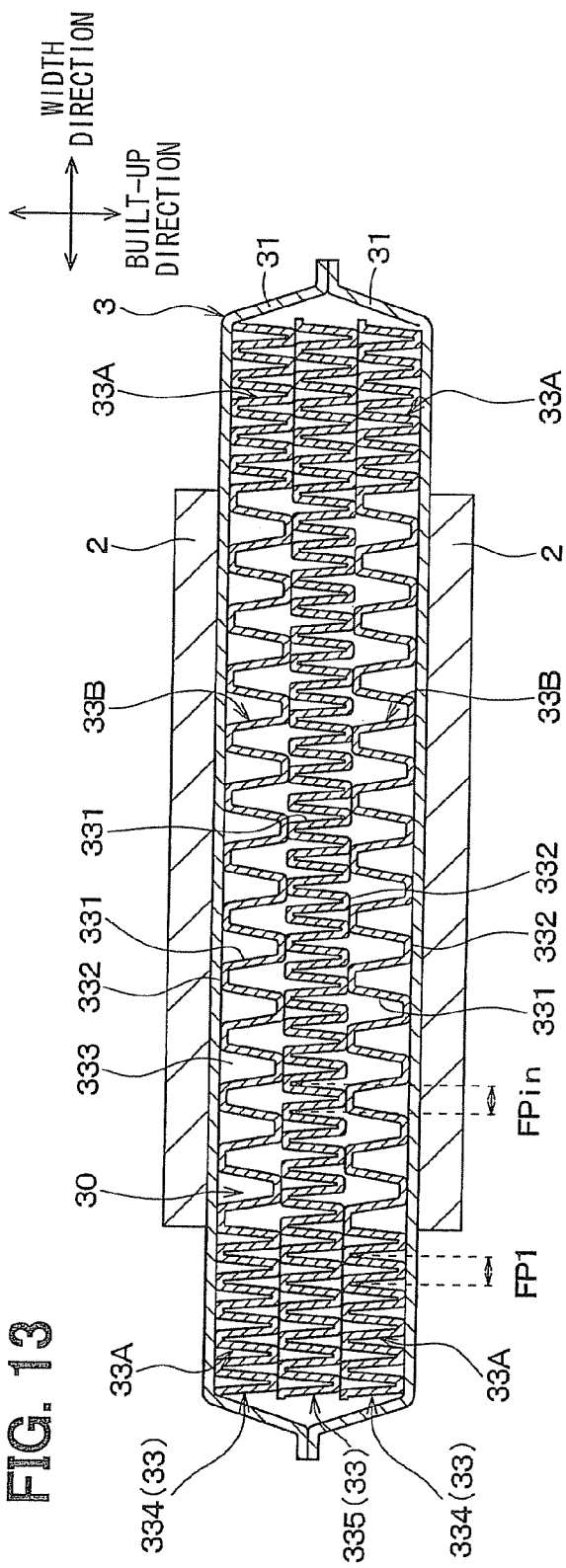
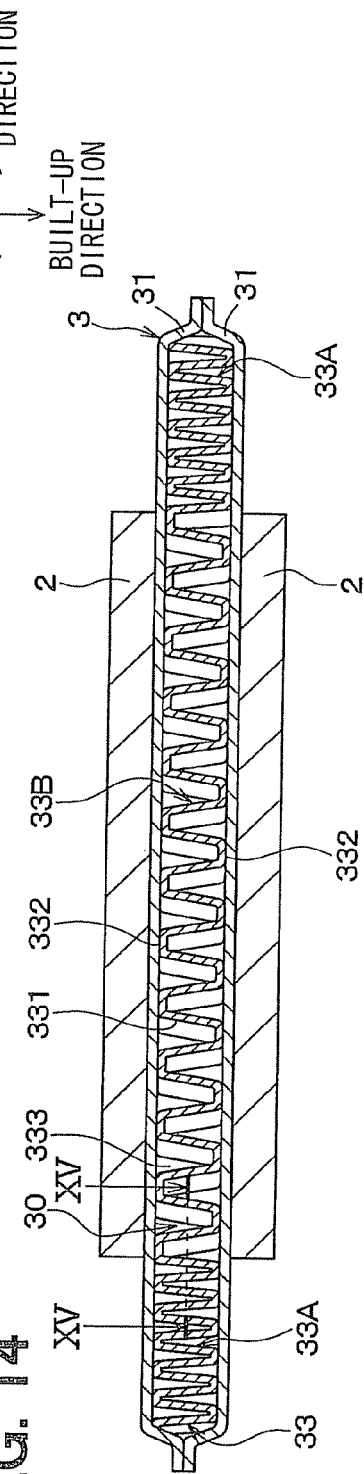

HEAT EXCHANGER

CROSS REFERENCE TO RELATED APPLICATION

This application is based on Japanese Patent Application No. 2011-28682 filed on Feb. 14, 2011 and No. 2011-28683 filed on Feb. 14, 2011, the disclosures of which are incorporated herein by reference.

FIELD OF THE INVENTION

The present invention relates to a heat exchanger for exchanging heat between heating medium flowing through a fluid pipe and a physical object (to be cooled down) provided at an outer side of the fluid pipe.

BACKGROUND OF THE INVENTION

A heat exchanger of this kind is known in the art, for example, as disclosed in Japanese Patent Publication No. 2005-191527, according to which an inner fin is provided in a fluid pipe, through which heating medium flows, so as to increase a heat transfer area between the heating medium and the fluid pipe, so that heat exchange between the heating medium and a physical object (to be cooled down through heat exchange) is facilitated and thereby heat exchange performance is improved.

According to the heat exchanger of the above prior art (Japanese Patent Publication No. 2005-191527), in a case that a width dimension in the fluid pipe does not coincide with a value, which is calculated by multiplying a fin pitch of the inner fin by an integral number, it is not possible to equally arrange the inner fin in the fluid pipe over its entire width direction. In other words, there remains such a space in the fluid pipe, in which the inner fin does not exist. In such a case, since the heating medium preferentially flows through such a space (in which the inner fin does not exist), the heat exchange performance may be decreased as a result that an amount of the heating medium flowing through a space in which the inner fin is provided in the fluid pipe will be decreased.

SUMMARY OF THE INVENTION

The present invention is made in view of the above problems. It is an object of the present invention to provide a heat exchanger, according to which heat exchange performance is improved.

According to a feature of the present invention (for example, as defined in the appended claim 1), multiple inner fins are provided in a fluid passage forming member for dividing a fluid passage into multiple small fluid passages so as to facilitate heat exchange between heating medium and the fluid passage forming member of a heat exchanger. The inner fins are built up in a multi-layer structure in an arranging direction for arranging a physical object on the fluid passage forming members. In the heat exchanger, fluid resistance for the heating medium in the small fluid passages formed by one of the inner fins, which is closer to the fluid passage forming member than the other inner fin, is smaller than fluid resistance for the heating medium in the small fluid passages formed by the other inner fin.

According to the above feature, since the fluid resistance for the heating medium in the small fluid passages formed by one of the inner fins, which is closer to the fluid passage forming member than the other inner fin, is smaller than the fluid resistance for the heating medium in the small fluid passages formed by the other inner fin, a flow amount of the heating medium passing through the small fluid passages formed by one of the inner fins, which is closer to the fluid passage forming member than the other inner fin, becomes larger than a flow amount of the heating medium passing through the small fluid passages formed by the other inner fin. As a result, flow speed of the heating medium flowing into the small fluid passages formed by one of the inner fins, which is closer to the fluid passage forming member than the other inner fin, can be increased, and thereby heat exchange efficiency can be improved.

According to another feature of the present invention (for example, as defined in the appended claim 6), an inner fin is provided in a fluid passage forming member for dividing a fluid passage into multiple small fluid passages so as to facilitate heat exchange between heating medium and a physical object for the heat exchange. The inner fin is formed in a wave shape, in a cross section perpendicular to a flow direction of the heating medium, so that projecting portions are alternately projecting in one direction and in the other direction. The inner fin is composed of multiple fin portions, fin pitches of which are different from each other, wherein the fin pitch is defined as a distance between centers of the neighboring two projecting portions, which are projecting in the same direction of either the one direction or the other direction.

Since the inner fin is composed of the multiple fin portions, the fin pitches of which are different from each other, a portion of the inner fin is so formed that the fin pitch thereof is smaller than that of the other portions. It is, therefore, possible to arrange the inner fin over the entire space of the fluid passage forming member in a width direction, when the length and/or the fin pitch of the fin portion (having the smaller fin pitch) is changed depending on the length of the fluid passage forming member in the width direction. As a result, since it is possible to prevent the heating medium from preferentially passing through only a part of the fluid passage in the fluid passage forming member, the heat exchange efficiency can be improved.

BRIEF DESCRIPTION OF THE DRAWINGS

The above and other objects, features and advantages of the present invention will become more apparent from the following detailed description made with reference to the accompanying drawings. In the drawings:

FIGS. 8A and 8B are schematically enlarged cross sectional views, respectively showing a portion of an inner fin 33 according to the sixth embodiment, wherein FIG. 8A shows an outside inner fin 338 and FIG. 8B shows an inside inner fin 339;

FIGS. 9A and 9B are schematically enlarged cross sectional views, respectively showing a portion of an inner fin 33 according to a seventh embodiment, wherein FIG. 9A shows an outside inner fin 338 and FIG. 9B shows an inside inner fin 339;

FIG. 11 is a schematically enlarged cross sectional view showing a neighboring portion of a fluid pipe 3 according to a ninth embodiment;

FIG. 12 is a schematically enlarged cross sectional view showing a neighboring portion of a fluid pipe 3 according to a tenth embodiment;

FIG. 13 is a schematically enlarged cross sectional view showing a neighboring portion of a fluid pipe 3 according to an eleventh embodiment;

FIG. 14 is a schematically enlarged cross sectional view showing a neighboring portion of a fluid pipe 3 according to a twelfth embodiment;

DETAILED DESCRIPTION OF THE PREFERRED EMBODIMENTS

Figure 1:
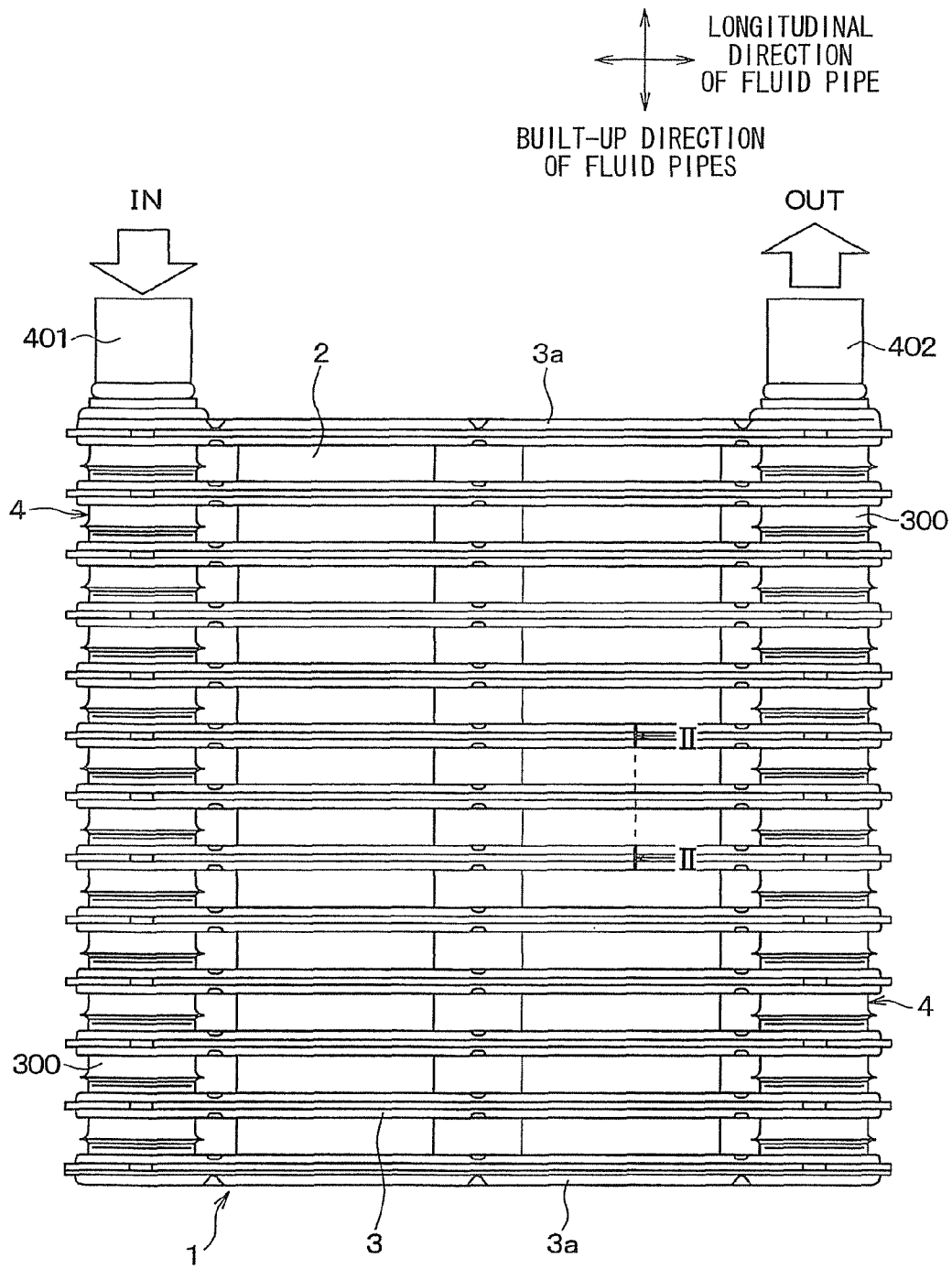
FIG. 1 is a schematic front view showing a built-up type heat exchanger 1 according to a first embodiment of the present invention.

The present invention will be explained by way of examples with reference to the drawings. The same reference numerals are used throughout multiple embodiments, for the purpose of designating the same of similar parts or portions.

First Embodiment

A first embodiment will be explained with reference to FIGS. 1 and 2. FIG. 1 is a front view showing a built-up type heat exchanger 1 of the first embodiment.

As shown in FIG. 1, the built-up heat exchanger 1 cools down a physical object (multiple electronic parts 2) from its both sides. The heat exchanger 1 has multiple fluid pipes 3 forming multiple fluid passages 30 (FIG. 2) for heating medium and multiple connecting members 4 for connecting the neighboring fluid pipes 3 with each other. Each of the fluid pipes 3 is formed in a flat tube shape and the multiple fluid pipes 3 are built up so as to arrange the electronic parts 2 between them. Both sides (an upper side and a lower side in FIG. 1) of each electronic part 2 are in contact with the respective neighboring fluid pipes 3.

According to the present embodiment, the electronic part 2 is composed of a semiconductor module having therein a semiconductor device (such as, an IGBT device) and a diode. The semiconductor module can be used for an inverter for an automotive vehicle, an inverter for driving a motor of an industrial machine, an inverter for an air conditioner for a building, and so on. A power transistor, a power FET, an IGBT and so on may be also used as the electronic part 2.

Fluid, such as, air, water, oil or the like is used as the heating medium. More exactly, in a case that the heat exchanger 1 of the present embodiment is mounted in the automotive vehicle, engine cooling water, oil or the like can be used as the heating medium. According to the present embodiment, water is used as the heating medium, in which antifreeze liquid (ethylene-glycol based) is mixed.

Figure 2:
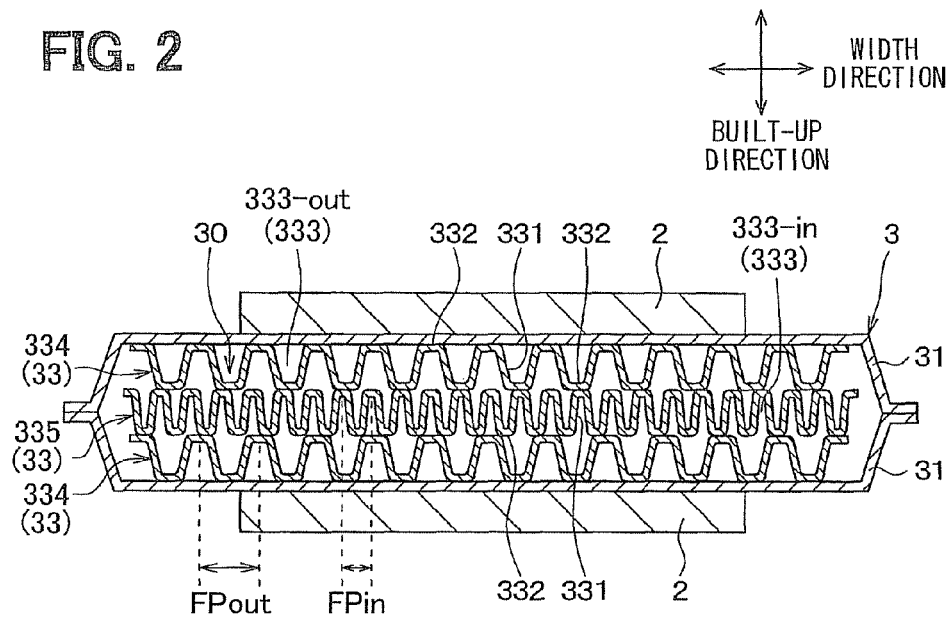
FIG. 2 is a schematically enlarged cross sectional view, taken along a line II-II in FIG. 1, showing a neighboring portion of a fluid pipe 3 according to a first embodiment.

FIG. 2 is a cross sectional view taken along a line II-II in FIG. 1. As shown in FIG. 2, each of the fluid pipes 3 is formed in a so-called drawn-cup structure. Namely, each of the fluid pipes 3 is composed of a pair of cup-shaped flat plate members 31, which are connected to each other face-to-face to form the fluid passage 30 between them. Multiple inner fins 33 (334, 335) are provided in the fluid pipe 3 so as to divide the space of the fluid pipe 3 (that is, the fluid passage 30) into multiple small fluid passages 333 to facilitate the heat exchange between the heating medium and the electronic parts 2.

Referring back to FIG. 1, each of the electronic parts 2 is arranged at an outer surface of the fluid pipe 3. More exactly, two electronic parts 2 are respectively arranged on each of the plate members 31 of the fluid pipe 3. The respective two electronic parts 2 are located in series between the neighboring fluid pipes 3 in a flow direction of the heating medium. According to the present embodiment, two electronic parts 2 are arranged between the plate members 31 of the neighboring fluid pipes 3. However, the number of the electronic parts 2 may be one or more than two.

Flanged portions 300 of a cylindrical shape are formed at each longitudinal end of the plate member 31 so that each of the flanged portions 300 projects toward the neighboring fluid pipe 3. The neighboring flanged portions 300 of the fluid pipes 3 are fixed to each other by soldering, to thereby form the multiple connecting members 4 for connecting the neighboring fluid pipes 3 with each other.

A pair of outermost fluid pipes 3a is arranged at both sides of the multiple fluid pipes 3 in a built-up direction thereof, namely at an upper side and a lower side in FIG. 1. An inlet port 401 and an outlet port 402 for the heating medium are formed at each end of the longitudinal direction of the outermost fluid pipe 3a (that is, the upper side fluid pipe 3a in FIG. 1), so that the heating medium flows into the heat exchanger 1 through the inlet port 401, while the heating medium flows out of the heat exchanger 1 through the outlet port 402. The inlet port 401 as well as the outlet port 402 is fixed to the outermost fluid pipe 3a by soldering. According to the present embodiment, the fluid pipes 3, the connecting members 4, the inlet port 401 and the outlet port 402 are made of aluminum.

The heating medium, which entered into the heat exchanger 1 through the inlet port 401, further flows into the respective fluid pipes 3 via the connecting members 4 and passes through the respective fluid passages 30 from each of longitudinal one ends (a left-hand end) toward each of longitudinal other ends (a right-hand end) of the fluid passage 30. Then, the heating medium is discharged from the outlet port 402 through the connecting members 4. As above, during the heating medium passes through the fluid passages 30, the heat exchange with the electronic parts 2 is carried out to thereby cool down the electronic parts 2.

As shown in FIG. 2, each of the inner fins 33 (334, 335) is formed in a wave shape. More in detail, in a cross section perpendicular to the longitudinal direction of the fluid pipe 3, namely the flow direction of the heating medium, each of the inner fins 33 has projecting portions alternately projecting in one direction and in the other direction. Further in detail, each of the inner fins 33 extends in the longitudinal direction of the fluid pipe and each of the inner fins 33 has multiple plate portions 331 and multiple connecting portions 332 for connecting neighboring plate portions 331 to each other. Therefore, each inner fin 33 is a straight fin having a trapezoidal wave form in the cross section perpendicular to the longitudinal direction of the fluid pipe.

As shown in FIG. 2, three inner fins 33 (334, 335) are built up in the fluid pipe 3 in an arranging direction of arranging the electronic parts 2 on the fluid pipes 3. More exactly, the inner fins 33 are built up in a three layer structure in a built-up direction of the fluid pipes 3. According to the present embodiment, each of the inner fins 33 in each of the built-up layers is formed as an independent part from each other.

The inner fins 33, which are in contact with the plate members 31 and located at the closest position to the electronic parts 2, are called as outside inner fins 334, while the inner fin 33 arranged between the two outside inner fins 334 is called as an inside inner fin 335. As above, two outside inner fins 334 and one inside inner fin 335 are provided in one fluid passage 30 formed in the fluid pipe 3.

A fin pitch "FP" is defined in this specification as below. In the cross section of each inner fin 33, which is perpendicular to the longitudinal direction of the fluid pipe, the fin pitch "FP" is a distance between the neighboring projecting portions projecting in the same direction, namely a distance between a center of the connecting portion 332 and a center of the neighboring connecting portion 332. A fin pitch "FPout" of the outside inner fin 334 is made to be larger than a fin pitch "FPin" of the inside inner fin 335. According to the present embodiment, the fin pitch "FPout" of the outside inner fin 334 is almost double of the fin pitch "FPin" of the inside inner fin 335.

As above, since the fin pitch "FPout" of the outside inner fin 334 is made to be larger than the fin pitch "FPin" of the inside inner fin 335, fluid resistance for the heating medium in the small fluid passages 333 formed by the outside inner fin 334 (hereinafter, outside small fluid passages 333-out) becomes smaller than fluid resistance for the heating medium in the small fluid passages 333 formed by the inside inner fin 335 (hereinafter, inside small fluid passages 333-in). Accordingly, flow amount of the heating medium passing through the outside small fluid passages 333-out becomes larger than that passing through the inside small fluid passages 333-in. Therefore, flow speed of the heating medium passing through the outside small fluid passages 333-out, which are closer to the electronic parts 2 than the inside small fluid passages 333-in, can be increased, to thereby improve the heat exchange efficiency.

Second Embodiment

Figure 3:
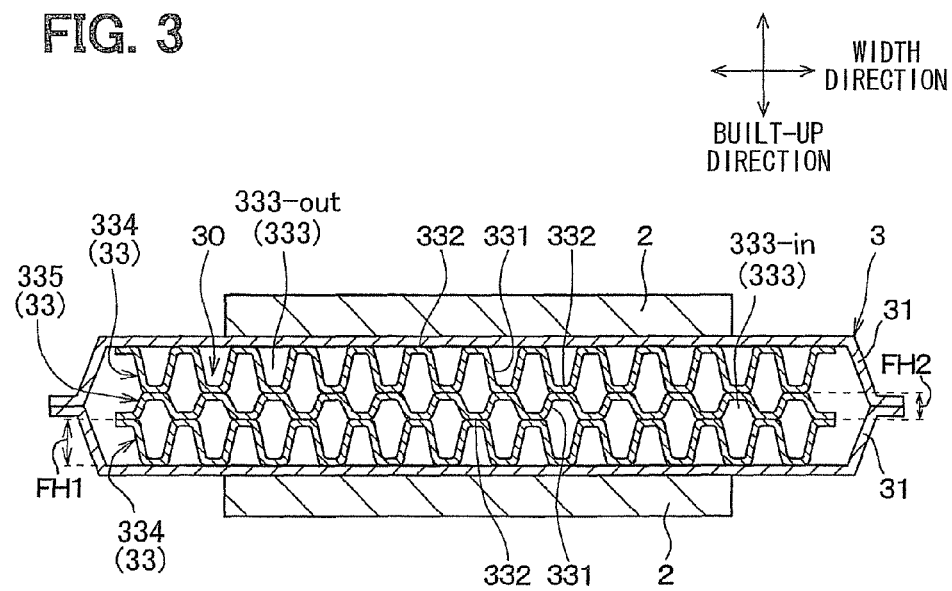
FIG. 3 is a schematically enlarged cross sectional view showing a neighboring portion of a fluid pipe 3 according to a second embodiment.

A second embodiment of the present invention will be explained with reference to FIG. 3. The second embodiment differs from the first embodiment in a fin height "FH" of the inner fins 33. FIG. 3 is an enlarged cross sectional view showing a neighboring portion of the fluid pipe 3 of the second embodiment and corresponds to FIG. 2 of the first embodiment.

A height of the inner fin 33 in the arranging direction of the electronic parts 2 and the fluid pipes 3, namely in the built-up direction of the fluid pipes 3, is defined as the fin height "FH". In other words, a distance, in the cross section perpendicular to the longitudinal direction of the fluid pipe 3, between the projecting portion projecting in one direction of the inner fin 33 and the projecting portion projecting in the other direction of the same inner fin 33, corresponds to the fin height "FH".

As shown in FIG. 3, the fin height "FH1" of the outside inner fin 334 is larger than the fin height "FH2" of the inside inner fin 335. According to the present embodiment, the fin height "FH1" of the outside inner fin 334 is almost 1.75 of the fin height "FH2" of the inside inner fin 335.

As above, since the fin height "FH1" of the outside inner fin 334 is made to be larger than the fin height "FH2" of the inside inner fin 335, the fluid resistance for the heating medium in the outside small fluid passages 333-out formed by the outside inner fin 334 becomes smaller than that for the heating medium in the inside small fluid passages 333-in formed by the inside inner fin 335. Accordingly, the flow amount of the heating medium passing through the outside small fluid passages 333-out becomes larger than that passing through the inside small fluid passages 333-in. Therefore, the same effect to that of the first embodiment can be obtained.

Third Embodiment

Figure 4:
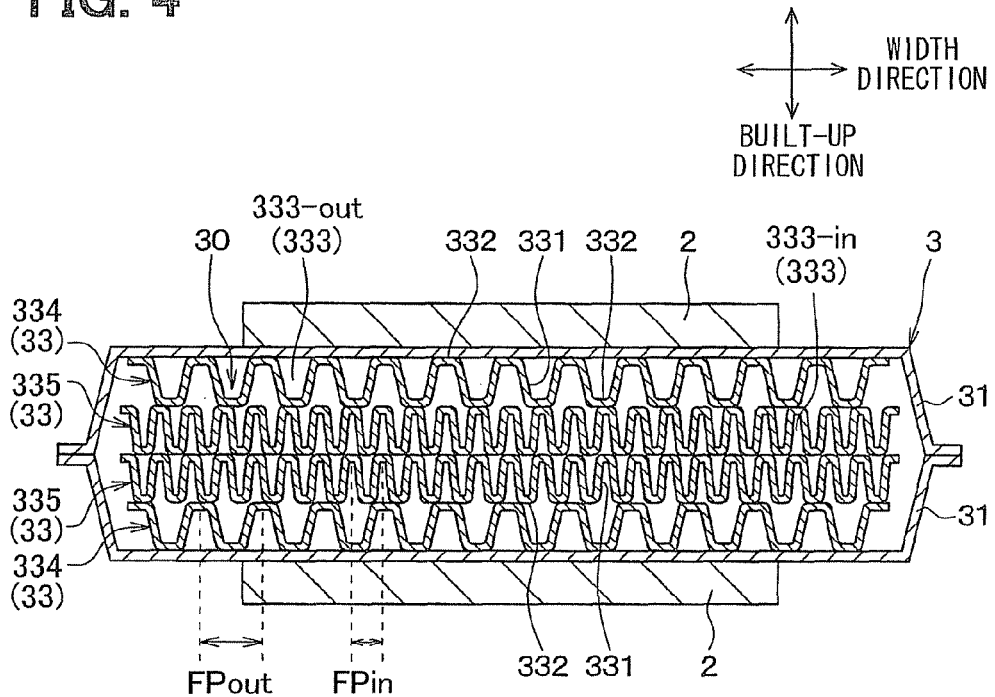
FIG. 4 is a schematically enlarged cross sectional view showing a neighboring portion of a fluid pipe 3 according to a third embodiment.

A third embodiment of the present invention will be explained with reference to FIG. 4. The third embodiment differs from the first embodiment in a number of built-up layers for the inner fins 33. FIG. 4 is an enlarged cross sectional view showing a neighboring portion of the fluid pipe 3 of the third embodiment and corresponds to FIG. 2 of the first embodiment.

As shown in FIG. 4, the inner fins 33 are built up in a four layer structure in the fluid passage 30 of the fluid pipe 3, in the arranging direction of the electronic parts 2 and the fluid pipes 3, namely in the built-up direction of the fluid pipes 3.

More in detail, the outside inner fins 334 are provided in the fluid pipe 3 in such a way that each of the outside inner fins 334 is in contact with the plate member 31 at a position closest to the electronic part 2. Two inside inner fins 335 are arranged in the fluid passage between the two outside inner fins 334.

As in the same manner to the first embodiment, the fin pitch "FPout" of the outside inner fins 334 is made to be larger than the fin pitch "FPin" of the inside inner fins 335. According to the present embodiment, the fin pitch "FPout" of the outside inner fin 334 is almost double of the fin pitch "FPin" of the inside inner fin 335.

According to the above structure, the fluid resistance for the heating medium in the outside small fluid passages 333-out formed by the outside inner fins 334 becomes smaller than that for the heating medium in the inside small fluid passages 333-in formed by the inside inner fins 335. As a result, the flow amount of the heating medium passing through the outside small fluid passages 333-out becomes larger than that passing through the inside small fluid passages 333-in. Therefore, the same effect to that of the first embodiment can be obtained.

Fourth Embodiment

Figure 5:
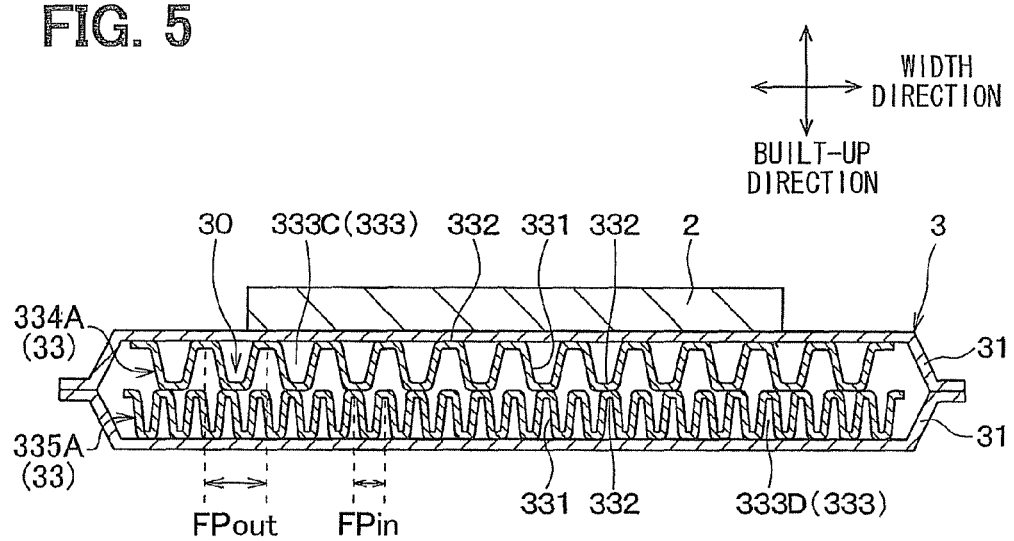
FIG. 5 is a schematically enlarged cross sectional view showing a neighboring portion of a fluid pipe 3 according to a fourth embodiment.

A fourth embodiment of the present invention will be explained with reference to FIG. 5. The fourth embodiment differs from the first embodiment in an arrangement of the electronic part 2 and a number of built-up layers for the inner fins 33. FIG. 5 is an enlarged cross sectional view showing a neighboring portion of the fluid pipe 3 of the fourth embodiment and corresponds to FIG. 2 of the first embodiment.

As shown in FIG. 5, the electronic part 2 is arranged on only one outside surface of the fluid pipe 3. In other words, the electronic part 2 is in contact with only one of the plate members 31 forming the fluid pipe 3.

The inner fins 33 are formed in a double layer structure in the fluid pipe 3, in the arranging direction of the electronic part 2 and the fluid pipe 3, that is, in the built-up direction of the fluid pipes 3. The inner fin 33, which is arranged at a position closer to the electronic part 2, is called as a first inner fin 334A, while the inner fin 33, which is arranged at a position far from the electronic part 2, is called as a second inner fin 335A. As above, one first inner fin 334A and one second inner fin 335A are provided in one fluid passage 30 formed by the fluid pipe 3.

The fin pitch "FPout" of the first inner fin 334A is made to be larger than the fin pitch "FPin" of the second inner fin 335A. According to the present embodiment, the fin pitch "FPout" of the first inner fin 334A is almost double of the fin pitch "FPin" of the second inner fin 335A.

According to the above structure, the fluid resistance for the heating medium in the small fluid passages 333 formed by the first inner fin 334A (hereinafter referred to as first small fluid passages 333C) becomes smaller than that for the heating medium in the small fluid passages 333 formed by the second inner fins 335A (hereinafter referred to as second small fluid passages 333D). As a result, the flow amount of the heating medium passing through the first small fluid passages 333C becomes larger than that passing through the second small fluid passages 333D. Therefore, flow speed of the heating medium passing through the first small fluid passages 333C, which are closer to the electronic parts 2 than the second small fluid passages 333D, can be increased, to thereby improve the heat exchange efficiency.

Fifth Embodiment

Figure 6:
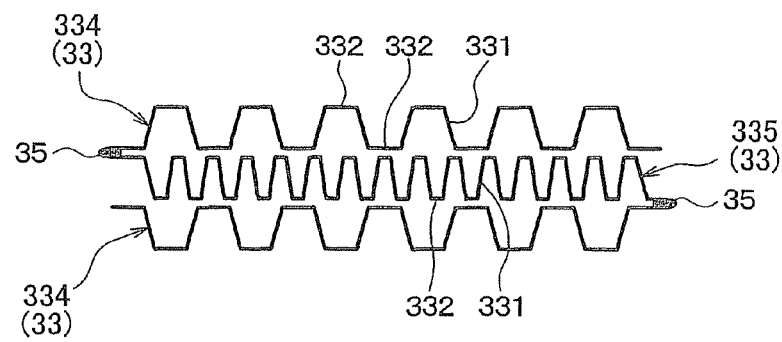
FIG. 6 is a schematically enlarged cross sectional view showing an inner fin 33 according to a fifth embodiment.

A fifth embodiment of the present invention will be explained with reference to FIG. 6. The fifth embodiment differs from the first embodiment in a manufacturing process for the inner fins 33. FIG. 6 is a schematic enlarged view showing the inner fins 33 of the present embodiment.

As shown in FIG. 6, the inner fin 33 is formed in the three layer structure and the inner fin 33 is made of one continuing metal sheet, which is folded at two folding portions 35. More exactly, one portion of the continuing metal sheet (already corrugated in the wave shape) is folded at one folding portion 35 toward one side in the built-up direction of the fluid pipes, while the other portion of the metal sheet is folded at the other folding portion 35 toward the other side in the built-up direction of the fluid pipes.

According to the present embodiment, one continuing metal sheet is twice folded to form the inner fin 33 of the three layer structure. The same effect to the first embodiment can be obtained, while a number of parts (a number of inner fins) can be reduced.

Sixth Embodiment

Figure 7:
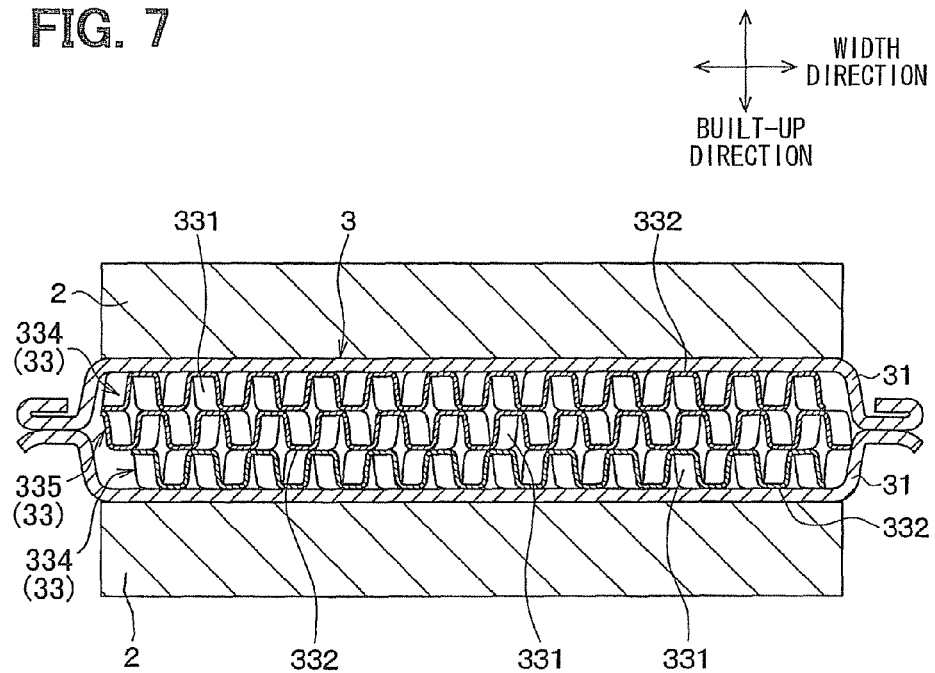
FIG. 7 is a schematically enlarged cross sectional view showing a neighboring portion of a fluid pipe 3 according to a sixth embodiment.

A sixth embodiment of the present invention will be explained with reference to FIGS. 7, 8A and 8B. The sixth embodiment differs from the first embodiment in that a wave-type fin is used as the inner fins 33. FIG. 7 is an enlarged cross sectional view showing a neighboring portion of the fluid pipe 3 of the sixth embodiment and corresponds to FIG. 2 of the first embodiment.

As shown in FIG. 7, each of the inner fins 33 of the present embodiment extends in the longitudinal direction of the fluid pipe 3 (in the flow direction of the heating medium). Each of the inner fins 33 has multiple plate portions 331 for dividing the fluid passage 30 into multiple small fluid passages 333 and multiple connecting portions 332 for connecting the neighboring plate portions 331 to each other. The inner fin 33 is formed in the wave shape, as shown in FIG. 7, in the cross section perpendicular to the longitudinal direction of the fluid pipe 3 (the flow direction of the heating medium).

Furthermore, as shown in FIGS. 8A and 8B, when viewed the inner fin 33 in the built-up direction of the fluid pipes 3 (in the direction of arranging the electronic parts 2 on the fluid pipes 3), the plate portions 331 are curved in a wave form in the flow direction of the heating medium. The inner fin 33 of this kind is called as the wave-type inner fin. According to the above structure, fluid flow of the heating medium is formed in the width direction of the fluid passage 30 in the fluid pipe 3, so that mixture of the heating medium can be facilitated.

FIGS. 8A and 8B are schematically enlarged cross sectional views, respectively showing a portion of the inner fins 33 according to the present embodiment, in each cross section perpendicular to the built-up direction of the fluid pipes 3 and crossing centers of the small fluid passages 333 in the built-up direction. FIG. 8A shows the outside inner fin 338 (equal to 334 of FIG. 7) and FIG. 8B shows the inside inner fin 339 (equal to 335 of FIG. 7).

A pitch of the waveform of the plate portions 331 is defined as the wave pitch "WP" for the inner fin 33, which is measured in the cross section perpendicular to the built-up direction of the fluid pipe 3 and crossing the centers of the small fluid passages 333 in the built-up direction.

As shown in FIGS. 8A and 8B, a wave pitch "WP1" of the outside inner fin 338 is made to be larger than a wave pitch "WP2" of the inside inner fin 339. As a result, the pressure loss of the heating medium passing through outside small fluid passages 333E defined by the outside inner fins 338 becomes smaller than the pressure loss of the heating medium passing through inside small fluid passages 333F defined by the inside inner fin 339.

Therefore, the flow amount of the heating medium passing through each of the outside small fluid passages 333E becomes larger than that passing through each of the inside small fluid passages 333F. In other words, the flow speed of the heating medium passing through the outside small fluid passages 333E facing to the electronic parts 2 is increased and thereby the heat exchange efficiency can be further improved.

Seventh Embodiment

A seventh embodiment of the present invention will be explained with reference to FIGS. 9A and 9B. The seventh embodiment differs from the sixth embodiment in a wave depth "WD" of the inner fins 33.

FIGS. 9A and 9B are schematically enlarged cross sectional views, respectively showing a portion of the inner fins 33 according to the present embodiment, in each cross section perpendicular to the built-up direction of the fluid pipes 3 and crossing centers of the small fluid passages 333 in the built-up direction. FIG. 9A shows the outside inner fin 338 and FIG. 9B shows the inside inner fin 339. A wave depth "WD" of the plate portion 331 is defined as a dimension of a waveform of the plate portion 331 in an amplitude direction, which is measured in the cross section perpendicular to the built-up direction of the fluid pipes 3 and crossing centers of the small fluid passages 333 in the built-up direction.

As shown in FIGS. 9A and 9B, a wave depth "WD1" of the outside inner fin 338 is made to be smaller than a wave depth "WD2" of the inside inner fin 339. As a result, the pressure loss of the heating medium passing through the outside small fluid passages 333E becomes larger than the pressure loss of the heating medium passing through the inside small fluid passages 333F.

Therefore, the flow amount of the heating medium passing through each of the outside small fluid passages 333E becomes larger than that passing through each of the inside small fluid passages 333F. In other words, the flow speed of the heating medium passing through the outside small fluid passages 333E facing to the electronic parts 2 is increased and thereby the heat exchange efficiency can be further improved.

Eighth Embodiment

Figure 10:
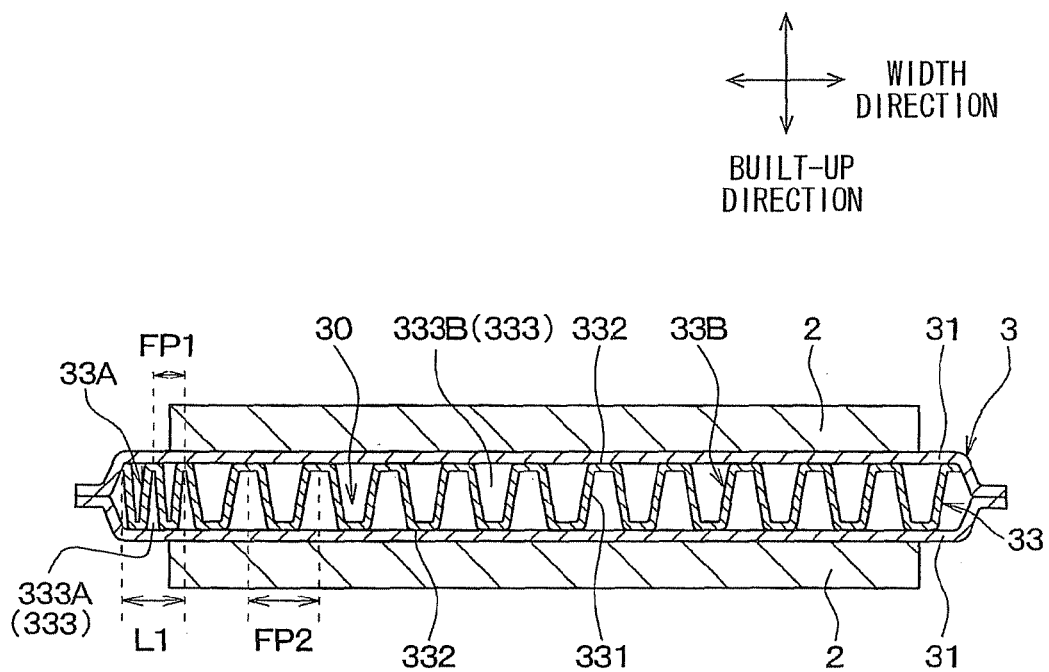
FIG. 10 is a schematic cross sectional view, also taken along the line II-II in FIG. 1, showing a neighboring portion of a fluid pipe 3 according to an eighth embodiment.

An eighth embodiment will be explained with reference to FIG. 10. The inner fin 33 is composed of a first fin portion 33A and a second fin portion 33B, the fin pitches "FP" of which are different from each other. According to the present embodiment, the first and second fin portions 33A and 33B are integrally formed.

As in the same manner to the above embodiments, the fin pitch "FP" is defined in this specification as below. In the cross section of the inner fin 33, which is perpendicular to the longitudinal direction of the fluid pipe, the fin pitch "FP" is a distance between the neighboring projecting portions, namely a distance between a center of the connecting portion 332 and a center of the neighboring connecting portion 332. In the two fin portions 33A and 33B, the fin pitch "FP (FP1)" of the first fin portion 33A is smaller than the fin pitch "FP (FP2)" of the second fin portion 33B.

A width direction of the fluid passage 30 is defined as a direction, which is perpendicular not only to the longitudinal direction of the fluid pipe 3 (that is, the flow direction of the heating medium) but also the build-up direction of the fluid pipes 3.

A length "L1" of the first fin portion 33A in the width direction is made to be smaller than the fin pitch "FP2" of the second fin portion 33B. In other words, the first fin portion 33A is arranged in a space equal to or smaller than one fin pitch "FP2" of the second fin portion 33B. According to the present embodiment, the first fin portion 33A is arranged at one side of the fluid passage 30 in the width direction.

As above, the inner fin 33 is composed of the first fin portion 33A and the second fin portion 33B, the fin pitches "FP" of which are different from each other, in order that the inner fin 33 has the portion (the first fin portion 33A) having the smaller fin pitch than the other portion (the second fin portion 33B). Accordingly, it is possible to arrange the inner fin 33 over the entire space of the fluid pipe 3 (that is, the fluid passage 30) in the width direction, when the length "L1" and/or the fin pitch "FP1" of the first fin portion 33A is changed depending on the length of the fluid passage 30 in the width direction. Since it is possible to prevent the heating medium from preferentially passing through only the part of the fluid passage 30 in the fluid pipe 3, the heat exchange efficiency can be improved.

As explained above, since the fin pitch "FP1" of the first fin portion 33A is smaller than the fin pitch "FP2" of the second fin portion 33B, pressure loss of the heating medium passing through first small fluid passages 333A (which are a portion of the small fluid passages 333 defined by the first fin portion 33A) becomes larger than pressure loss of the heating medium passing through second small fluid passages 333B (which are formed by the second fin portion 33B).

According to the present embodiment, therefore, the length "L1" of the first fin portion 33A is made to be smaller than the fin pitch "FP2" of the second fin portion 33B. According to such a feature, it is possible to arrange the second fin portion 33B (having the larger fin pitch than the first fin portion 33A) as much as possible, to thereby suppress a possible increase of the pressure loss. Thus, the heat exchange efficiency can be improved.

Ninth Embodiment

A ninth embodiment of the present invention will be explained with reference to FIG. 11. The ninth embodiment differs from the eighth embodiment in that the first fin portions 33A are formed at two portions. FIG. 11 is an enlarged cross sectional view showing a neighboring portion of the fluid pipe 3 of the ninth embodiment and corresponds to FIG. 10 of the eighth embodiment.

As shown in FIG. 11, a length of the electronic part 2 in the width direction is smaller than a length of the fluid pipe 3 in the width direction. Each of the electronic parts 2 is located on the outer surface of the fluid pipe 3 at a center of the width direction.

The inner fin 33 is composed of two first fin portions 33A and one second fin portion 33B. More exactly, the first fin portions 33A are arranged at both sides of the second fin portion 33B. The second fin portion 33B has a length almost equal to that of the electronic part 2 and is located in the fluid pipe 3 at a position corresponding to the electronic part 2. In other words, the second fin portion 33B opposes to (faces to) the electronic part 2 along the width direction. The first fin portions 33A are located at such positions in the fluid pipe 3, which are not corresponding to the electronic part 2 (in other words, at such portions at which the electronic part 2 is not in contact with the fluid pipe 3).

According to the above structure, the pressure loss of the heating medium passing through the portions of the fluid passage 30 not facing to the electronic part 2 (that is, the small fluid passages formed by the first fin portions 33A) becomes larger than the pressure loss of the heating medium passing through the other portion of the fluid passage 30 facing to the electronic part 2 (that is, the small fluid passages formed by the second fin portion 33B). As a result, the flow amount of the heating medium passing through the fluid passage portion facing to the electronic part 2 is increased, namely flow speed of the heating medium in such fluid passage portion is increased, and thereby the heat exchange efficiency is further improved.

Tenth Embodiment

A tenth embodiment of the present invention will be explained with reference to FIG. 12. The tenth embodiment differs from the eighth embodiment in that two inner fins 33 are built up in a double layer structure in the fluid pipe 3. FIG. 12 is an enlarged cross sectional view showing a neighboring portion of the fluid pipe 3 of the tenth embodiment and corresponds to FIG. 11 of the ninth embodiment.

As shown in FIG. 12, two inner fins 33 are built up in the space between the pair of the plate members 31 (that is, the fluid passage 30) in the built-up direction of the fluid pipes 3, namely in a direction of arranging the electronic parts 2 on the fluid pipes 3. Each of the inner fins 33 is formed in the same manner to the inner fin 33 of the ninth embodiment (FIG. 11). Namely, in each of the inner fins 33, the first fin portions 33A are formed at both sides of the second fin portion 33B. Each of the second fin portions 33B is located in the fluid pipe 3 at such a position facing to the electronic part 2, while the first fin portions 33A are located in the fluid pipe 3 at such positions not facing to the electronic part 2. The built-up two inner fins 33 are symmetric to each other with respect to a virtual plane perpendicular to the built-up direction of the fluid pipes 3.

According to the present embodiment, as above, the two inner fins 33 are built up and the first fin portions 33A having smaller fin pitch "FP" than the second fin portion 33B are arranged in the fluid pipe 3 at such positions not facing to the electronic parts 2. According to such a structure, the pressure loss of the heating medium passing through the fluid passage portions not facing to the electronic parts 2 becomes larger, so that the flow amount of the heating medium passing through the fluid passage portion facing to the electronic parts 2 becomes larger. As a result, the flow speed of the heating medium is increased in such area and the heat exchange efficiency can be increased as in the same manner to the ninth embodiment (FIG. 11).

Eleventh Embodiment

An eleventh embodiment of the present invention will be explained with reference to FIG. 13 The eleventh embodiment differs from the ninth embodiment in that three inner fins 33 are built up in a three layer structure in the fluid pipe 3. FIG. 13 is an enlarged cross sectional view showing a neighboring portion of the fluid pipe 3 of the eleventh embodiment and corresponds to FIG. 11 of the ninth embodiment.

As shown in FIG. 13, three inner fins 33 are built up in the space between the pair of the plate members 31 (that is, the fluid passage 30) in the built-up direction of the fluid pipes 3, namely in the direction of arranging the electronic parts 2 on the fluid pipes 3. The inner fins 33, which are in contact with the plate members 31, are called as the outside inner fins 334, while the inner fin 33 arranged between the two inner fins (the outside inner fins 334) is called as the inside inner fin 335.

Each of the outside inner fins 334 is formed in the same manner to the inner fin 33 of the ninth embodiment. Namely, in each of the outside inner fins 334, two first fin portions 33A are formed at both sides of the second fin portion 33B. Each of the second fin portions 33B is located in the fluid pipe 3 at such a position facing to the respective electronic part 2, while each of the first fin portions 33A is located in the fluid pipe 3 at such a position not facing to the electronic part 2.

A fin pitch "$FP_{in}$" of the inside inner fin 335 is so made to be almost equal to the fin pitch "FP1" of the first fin portion 33A, which is the smallest in fin portions of the outside inner fins 334.

According to the present embodiment, as above, the three inner fins 33 are built up in the three layer structure and the first fin portions 33A of the outside inner fins 334 (which have smaller fin pitch "FP" than the second fin portion 33B) are arranged in the fluid pipe 3 at such positions not facing to the electronic parts 2. According to such a structure, the pressure loss of the heating medium passing through the fluid passage portions not facing to the electronic parts 2 becomes larger, so that the flow amount of the heating medium passing through the fluid passage portion facing to the electronic parts 2 becomes larger. As a result, the flow speed of the heating medium is increased in such area and the heat exchange efficiency can be increased as in the same manner to the ninth embodiment.

In addition, according to the present embodiment, the fin pitch "$FP_{in}$" of the inside inner fin 335 is so made to be almost equal to the fin pitch "FP1" of the first fin portion 33A, which is the smallest in the fin portions of the outside inner fins 334. As a result, the pressure loss of the heating medium passing through the fluid passage portion formed by the inside inner fin 335, that is the fluid passage portion formed in the center of the fluid passage 30 but not facing to the electronic parts 2, becomes larger. Therefore, the flow speed of the heating medium passing through the fluid passage portion, which is formed in outside areas in the fluid passage 30 respectively closer to the plate members 31 which are in contact with the electronic parts 2, is increased. The heat exchange efficiency can be surely and further improved.

Twelfth Embodiment

A twelfth embodiment of the present invention will be explained with reference to FIGS. 14 and 15. The twelfth embodiment differs from the ninth embodiment in that a wave-type inner fin 33 is provided in the fluid pipe 3. FIG. 14 is an enlarged cross sectional view showing a neighboring portion of the fluid pipe 3 of the twelfth embodiment and corresponds to FIG. 11 of the ninth embodiment.

As shown in FIG. 14, the inner fin 33 of the present embodiment extends in the longitudinal direction of the fluid pipe 3 (in the flow direction of the heating medium). The inner fin 33 has multiple plate portions 331 for dividing the fluid passage 30 into multiple small fluid passages 333 and multiple connecting portions 332 for connecting the neighboring plate portions 331 to each other. The inner fin 33 is formed in the wave shape, as shown in FIG. 14, in the cross section perpendicular to the longitudinal direction of the fluid pipe 3 (the flow direction of the heating medium).

Figure 15:
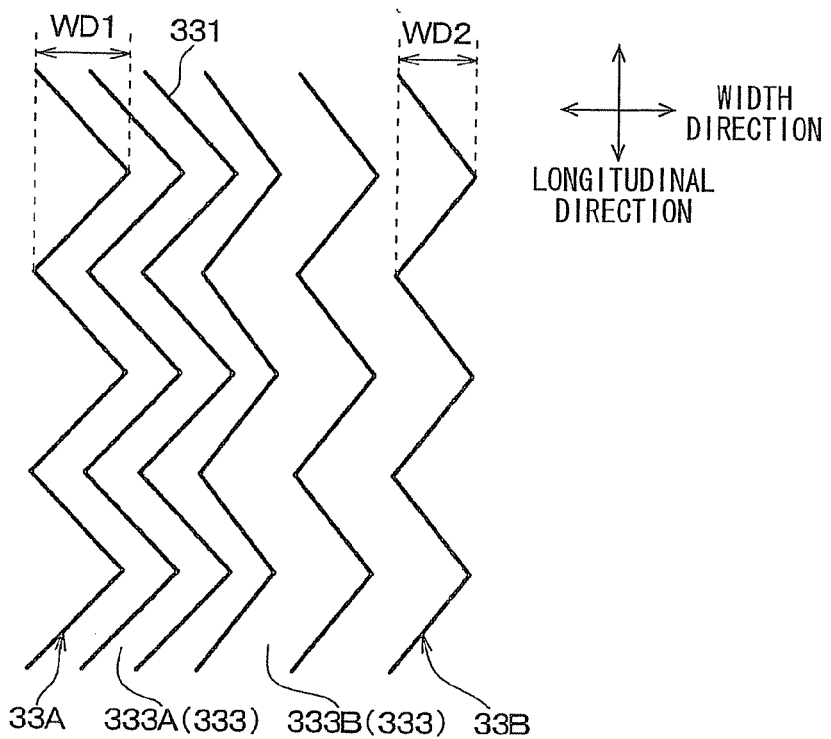
FIG. 15 is a schematic cross sectional view taken along a line XV-XV in FIG. 14.

Furthermore, as shown in FIG. 15, when viewed the inner fin 33 in the built-up direction of the fluid pipes 3 (in the direction of arranging the electronic parts 2 on the fluid pipes 3), the plate portions 331 are curved in a wave form in the flow direction of the heating medium. The inner fin 33 of this kind is called as the wave-type inner fin. According to the above structure, fluid flow of the heating medium is formed in the width direction of the fluid passage 30 in the fluid pipe 3, so that mixture of the heating medium can be facilitated.

FIG. 15 is a schematic cross sectional view taken along a line XV-XV in FIG. 14. A wave depth "WD" of the plate portion 331 is defined as a dimension of a waveform of the plate portion 331 in an amplitude direction, which is measured in a cross section perpendicular to the built-up direction of the fluid pipes 3 and crossing centers of the small fluid passages 333 in the built-up direction.

As shown in FIG. 15, a wave depth "WD1" of the first fin portion 33A is made larger than a wave depth "WD2" of the second fin portion 33B. As a result, the pressure loss of the heating medium passing through first small fluid passages 333A defined by the first fin portion 33A becomes larger than the pressure loss of the heating medium passing through second small fluid passages 333B defined by the second fin portion 33B.

Therefore, the flow amount of the heating medium passing through each of the second small fluid passages 333B becomes larger than that passing through each of the first small fluid passages 333A. In other words, the flow speed of the heating medium passing through the second small fluid passages 333B facing to the electronic parts 2 is increased and thereby the heat exchange efficiency can be further improved.

Thirteenth Embodiment

Figure 16:
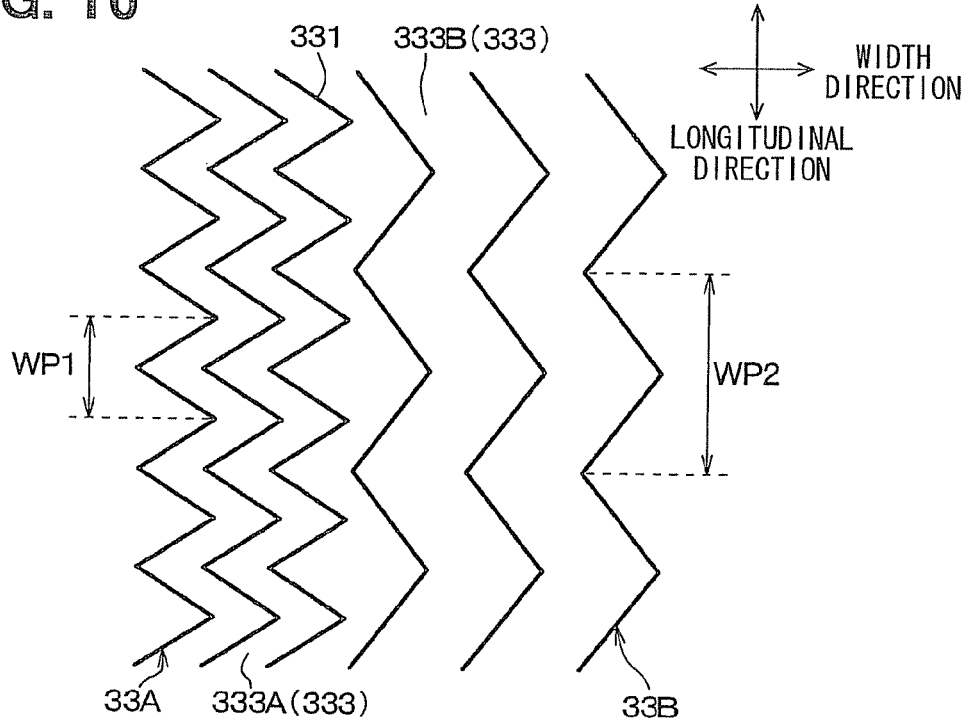
FIG. 16 is a schematically enlarged cross sectional view showing a portion of an inner fin 33 according to a thirteenth embodiment.

A thirteenth embodiment of the present invention will be explained with reference to FIG. 16. The thirteenth embodiment differs from the twelfth embodiment in that a wave pitch "WP" of the inner fin 33 is different from that in the twelfth embodiment. FIG. 16 is an enlarged cross sectional view showing a neighboring portion of the inner fin 33 of the thirteenth embodiment and corresponds to FIG. 15 of the twelfth embodiment.

A pitch of the waveform of the plate portions 331 is defined as the wave pitch "WP" for the inner fin 33, which is measured in the cross section perpendicular to the built-up direction of the fluid pipes 3 and crossing centers of the small fluid passages 333 in the built-up direction.

As shown in FIG. 16, a wave pitch "WP1" of the first fin portion 33A is made to be smaller than a wave pitch "WP2" of the second fin portion 33B. As a result, the pressure loss of the heating medium passing through the first small fluid passages 333A becomes larger than the pressure loss of the heating medium passing through the second small fluid passages 333B.

Therefore, the flow amount of the heating medium passing through each of the second small fluid passages 333B becomes larger than that passing through each of the first small fluid passages 333A. In other words, the flow speed of the heating medium passing through the second small fluid passages 333B facing to the electronic parts 2 is increased and thereby the heat exchange efficiency can be further improved.

Fourteenth Embodiment

A fourteenth embodiment of the present invention will be explained with reference to FIGS. 17 and 18. According to the present embodiment, a physical object for the heat exchange includes a semiconductor package device, in which a semiconductor device having a metal heat sink is resin sealed, and a heat radiating surface of such semiconductor package device is cooled down by a heat exchanger of the present invention.

Figure 17:
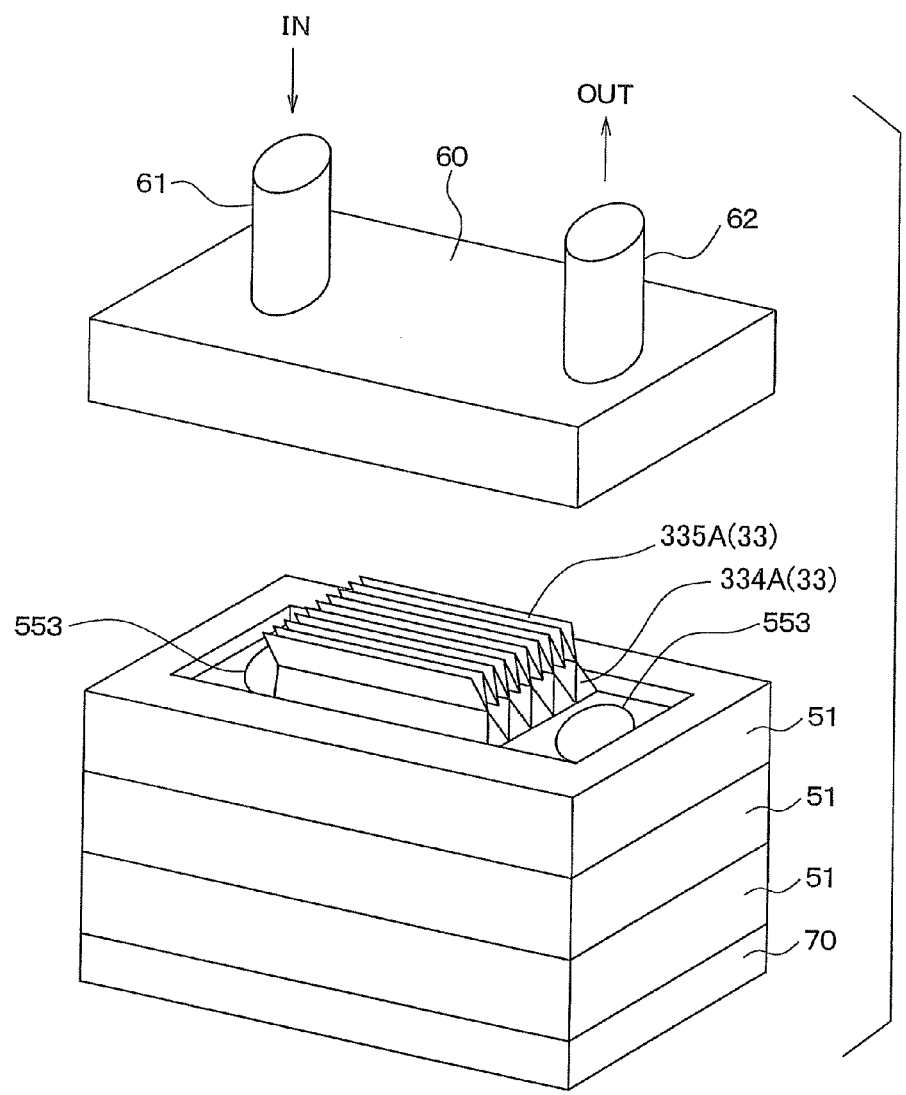
FIG. 17 is a schematic perspective view showing a heat exchanger according to a fourteenth embodiment.
Figure 18:
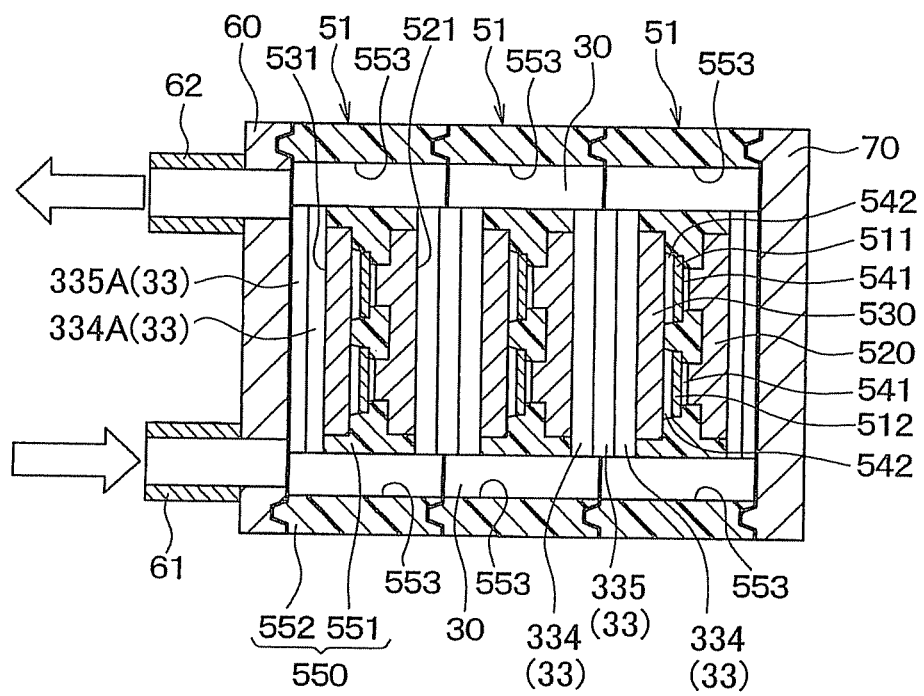
FIG. 18 is a schematic cross sectional view showing the heat exchanger according to the fourteenth embodiment.

FIG. 17 is a schematic perspective view showing a heat exchanger according to the fourteenth embodiment, and FIG. 18 is a schematic cross sectional view showing the heat exchanger of the present embodiment.

As shown in FIG. 18, a semiconductor package device 51 is composed of; a semiconductor device including a first semiconductor chip 511 and a second semiconductor chip 512; a metal member including a first (a right-hand side) heat sink 520 and a second (a left-hand side) heat sink 530; a conductive connecting member, such as soldering portions 541 and 542, and a sealing material such as a molding resin 550.

According to the semiconductor package device 51, the first and second semiconductor chips 511 and 512 are arranged in parallel to each other in a surface direction. In the present embodiment shown in FIG. 18, there are two semiconductor chips. However, one semiconductor chip or more than two semiconductor chips may be provided.

The first surface of each semiconductor chip 511 and 512 (that is, a right-hand side surface in FIG. 18) and the second surface of the first heat sink 520 (that is, a left-hand side surface in FIG. 18) are connected to each other by the first soldering portion 541. The second surface of each semiconductor chip 511 and 512 (that is, a left-hand side surface in FIG. 18) and the first surface of the second heat sink 530 (that is, a right-hand side surface in FIG. 18) are connected to each other by the second soldering portion 542. According to the present embodiment, the generally known various kinds of solders, such as, lead-free solder of Sn—Pb based solder, Sn—Ag based solder, and so on, may be used for the soldering portions 541 and 542.

According to the above structure, heat is radiated from the second surface of each semiconductor chip 511 and 512 via the second soldering portion 542 and the second heat sink 530, while the heat is radiated from the first surface of each semiconductor chip 511 and 512 via the first soldering portion 541 and the first heat sink 520.

As above, the first heat sink 520 and the second heat sink 530 are thermally connected to the first and second semiconductor chips 511 and 512 and form metal bodies for transferring the heat from the first and second semiconductor chips 511 and 512. In FIG. 18, the first surface (a right-hand side surface) of the first heat sink 520 forms the heat radiating surface 521, while the second surface (a left-hand side surface) of the second heat sink 530 forms the heat radiating surface 531. Each of the heat radiating surfaces 521 and 531 is exposed to the outside from the molding resin 550 (more exactly, from a sealing portion 551 explained below).

The first semiconductor chip 511 is composed of a power semiconductor device, for example, but not limited to, IGBT (Insulated Gate Bipolar Transistor), a thyristor and so on. The second semiconductor chip 512 is composed of, for example, FWD (a freewheel diode). Each of the first and second semiconductor chips 511 and 512 is formed in a flat rectangular shape.

Electrodes (not shown) are formed on the first and second surfaces (the right-hand side and left-hand side surfaces) of the respective semiconductor chips 511 and 512, wherein the electrodes are electrically connected to the soldering portions 541 and 542.

According to the present embodiment, therefore, the electrodes on the first surfaces (the right-hand side surfaces) of the respective semiconductor chips 511 and 512 are electrically connected to the first heat sink 520 via the first soldering portions 541, while the electrodes on the second surfaces (the left-hand side surfaces) of the respective semiconductor chips 511 and 512 are electrically connected to the second heat sink 530 via the second soldering portions 542.

The first and second heat sinks 520 and 530 are made of metal having high thermal and electrical conduction, for example, copper alloy, aluminum alloy and so on. Each of the first and second heat sinks 520 and 530 is made in an almost rectangular plate shape as a whole.

According to the heat exchanger of the present embodiment, the heat radiating surfaces 521 and 531 of the heat sinks 520 and 530 are cooled down by the heating medium. Accordingly, the heat radiating surfaces 521 and 531 of the heat sinks 520 and 530 correspond to the physical object for the heat exchange of the present invention.

As shown in FIG. 18, according to the heat exchanger of the present embodiment, a part of the molding resin 550 forms the fluid passage 30 for the heating medium. The molding resin 550 is composed of the sealing portion 551, which seals the semiconductor chips 511 and 512 and the heat sinks 520 and 530, and the wall portion 552 formed at the periphery of the sealing portion 551 and having the height (or length) larger than the height (or a length) of the sealing portion 551, so that the first end (a right-hand end) as well as the second end (a left-hand end) thereof outwardly projects from the heat radiating surfaces 521 and 531, respectively. Each of the first and second ends of the wall portion 552 is so formed as to surround the heat radiating surfaces 521 and 531.

A pair of through-holes 553 is formed in the sealing portion 551 between the heat radiating surfaces 521 and 531 of the heat sinks 520 and 530 and the wall portion 552 to form the fluid passages 30 for the heating medium.

As shown in FIG. 17, according to the heat exchanger of the present embodiment, multiple semiconductor package devices 51 are built up. More exactly, the multiple (three in FIG. 17) semiconductor package devices 51 are built up and the respective through-holes 553 are communicated to each other.

The first cover member 60 having the inlet port 61 and the outlet port 62 for the heating medium is attached to one axial side of the built-up semiconductor package device 51, wherein the inlet port 61 and the outlet port 62 are respectively communicated to the through-holes 553. In a similar manner, the second cover member 70 is attached to the other axial side of the built-up semiconductor package device 51 so as to close the through-holes 553. According to the above structure, the heating medium flows into the built-up semiconductor package device 51 via the inlet port 61 and flows out from the built-up semiconductor package device 51 via the outlet port 62.

One axial end of the wall portion 552 (for example, a left-hand side in FIG. 18) is connected to the other axial end of the wall portion 552 (for example, a right-hand side in FIG. 18) of the neighboring semiconductor package device 51 to form the built-up device. The first cover member 60 is connected to the one axial end of the wall portion 552 of a leftmost position, while the second cover member 70 is connected to the other axial end of the wall portion 552 of a rightmost position. The respective connections are made by adhesive material (not shown). For example, the first and second cover members 60 and 70 may be made of resin, metal or ceramic material by way of molding, press work and so on.

In the built-up semiconductor package device 51, the heat radiating surface 521 of one device 51 opposes to the heat radiating surface 531 of the other (neighboring) device 51. A space between the opposing heat radiating surfaces 521 and 531 forms a part of the fluid passage 30 for the heating medium. A space between the heat radiating surface 521 of the right-most device 51 and the second cover member 70 as well as a space between the heat radiating surface 531 of the left-most device 51 and the first cover member 60 also forms a part of the fluid passage 30. The opposing heating radiating surfaces 521 and 531, the molding resin 550 as well as the cover members 60 and 70 correspond to the fluid passage forming member.

The inner fins 33 are provided on each of the heat radiating surfaces 521 and 531 of the heat sinks 520 and 530 so as to divide the fluid passage 30 formed between the opposing devices 51 as well as the fluid passage 30 between the devices 51 and the cover members 60 and 70 into multiple small fluid passages, to thereby facilitate the heat exchange between the heating medium and the heat radiating surfaces 521 and 531 of the heat sinks 520 and 530. In the present embodiment, the straight fins are used for the inner fins 33.

More in detail, the inner fins 33 are formed in a three layer structure between the neighboring semiconductor package devices 51 in a built-up direction of the devices 51. Namely, the inner fins 33 of the three layer structure are provided between the opposing heat radiating surfaces 521 and 531 in the built-up direction of the devices 51.

The inner fins 33, which are in contact with the heat radiating surfaces 521 and 531, are called as outside inner fins 334, while the inner fin 33 arranged between the two outside inner fins 334 is called as the inside inner fin 335. Therefore, the two outside inner fins 334 and one inside inner fin 335 are provided between the neighboring devices 51. The fin pitch of the outside inner fin 334 is made to be larger than the fin pitch of the inside inner fin 335.

The inner fins 33 are formed in a double layer structure between the semiconductor package devices 51 and the cover members 60 and 70 in the built-up direction of the devices 51. Namely, the inner fins 33 of the double layer structure are provided between the heat radiating surfaces 521 and 531 and the cover members 60 and 70 in the built-up direction of the devices 51.

The inner fin 33, which is arranged at a position closer to the heat radiating surface 521 or 531, is called as a first inner fin 334A, while the inner fin 33, which is arranged at a position far from the heat radiating surface 521 or 531, is called as a second inner fin 335A. Therefore, one first inner fin 334A and one second inner fin 335A are provided between the respective semiconductor package devices 51 and the respective cover members 60 and 70. The fin pitch of the first inner fin 334A is made to be larger than the fin pitch of the second inner fin 335A.

As above, since the fin pitch of the outside inner fins 334 (which are in contact with the heat radiating surfaces 521, 531) is made to be larger than the fin pitch of the inside inner fin 335 (which is arranged at a position far from the heat radiating surfaces 521, 531), the fluid resistance for the heating medium in the outside small fluid passages (not shown) formed by the outside inner fins 334 becomes smaller than the fluid resistance for the heating medium in the inside small fluid passages (not shown) formed by the inside inner fin 335. Accordingly, the flow amount of the heating medium passing through the outside small fluid passages becomes larger than that passing through the inside small fluid passages. Therefore, the flow speed of the heating medium passing through the outside small fluid passages, which are closer to the heat radiating surface 521 or 531 than the inside small fluid passages, can be increased, to thereby improve the heat exchange efficiency.

In addition, according to the above structure, the fin pitch of the first inner fin 334A (which is in contact with the heat radiating surface 521 or 531) is made to be larger than the fin pitch of the second inner fin 335A (which is arranged at the position far from the heat radiating surface 521 or 531). Therefore, the fluid resistance for the heating medium in first small fluid passages (not shown) formed by the first inner fins 334A becomes smaller than that for the heating medium in second small fluid passages (not shown) formed by the second inner fins 335A. As a result, the flow amount of the heating medium passing through the first small fluid passages becomes larger than that passing through the second small fluid passages. Therefore, flow speed of the heating medium passing through the first small fluid passages, which are closer to the heat radiating surface 521 or 531 than the second small fluid passages, can be increased, to thereby improve the heat exchange efficiency.

Fifteenth Embodiment

A fifteenth embodiment of the present invention will be explained with reference to FIGS. 19 and 20.

Figure 19:
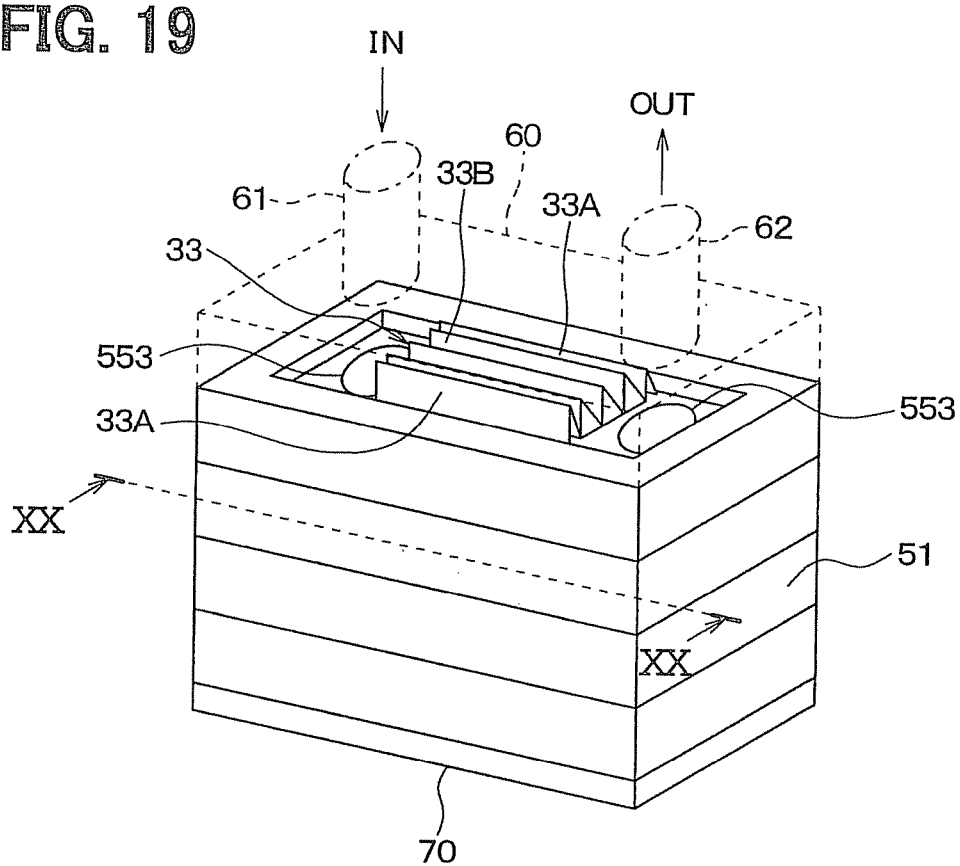
FIG. 19 is a schematic perspective view showing a heat exchanger according to a fifteenth embodiment.
Figure 20:
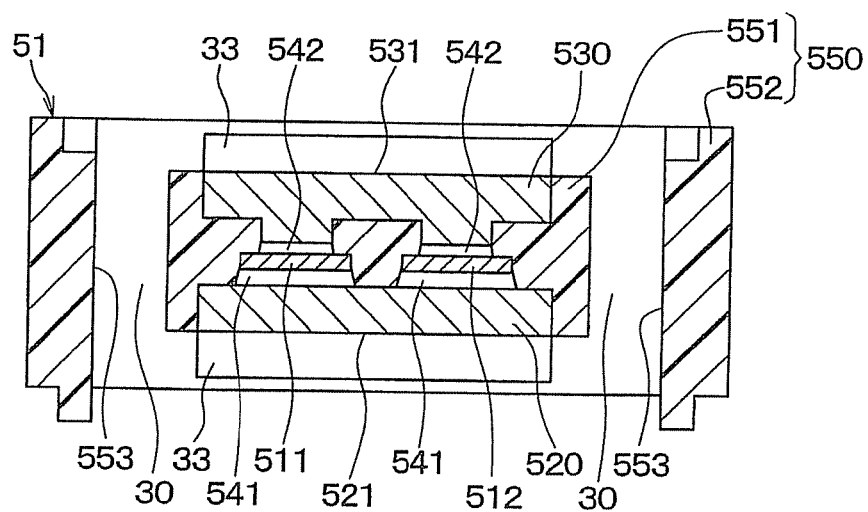
FIG. 20 is a schematic cross sectional view taken along a line XX-XX in FIG. 19.

FIG. 19 is a schematic perspective view showing a heat exchanger according to the fifteenth embodiment, and FIG. 20 is a schematic cross sectional view taken along a line XX-XX in FIG. 19.

In the similar manner to the fourteenth embodiment (FIGS. 17 and 18), as shown in FIG. 20, the semiconductor package device 51 is composed of; the semiconductor device including the first semiconductor chip 511 and the second semiconductor chip 512; the metal member including the first (a lower side) heat sink 520 and the second (an upper side) heat sink 530; the conductive connecting member, such as the soldering portions 541 and 542, and the sealing material such as the molding resin 550.

According to the semiconductor package device 51, the first and second semiconductor chips 511 and 512 are arranged in parallel to each other in a surface direction. In the present embodiment shown in FIG. 20, there are two semiconductor chips. However, one semiconductor chip or more than two semiconductor chips may be provided.

A first surface of each semiconductor chip 511 and 512 (that is, a lower side surface in FIG. 20) and a second surface of the lower side heat sink 520 (that is, an upper side surface in FIG. 20) are connected to each other by the first soldering portion 541. A second surface of each semiconductor chip 511 and 512 (that is, an upper side surface in FIG. 20) and a first surface of the upper side heat sink 530 (that is, a lower side surface in FIG. 20) are connected to each other by the second soldering portion 542. According to the present embodiment, a generally known various kinds of solders, such as, lead-free solder of Sn—Pb based solder, Sn—Ag based solder, and so on, may be used for the soldering portions 541 and 542.

According to the above structure, heat is radiated from the second surface (the upper side surface) of each semiconductor chip 511 and 512 via the second soldering portion 542 and the second heat sink 530 (the upper side heat sink), while the heat is radiated from the first surface (the lower side surface) of each semiconductor chip 511 and 512 via the first soldering portion 541 and the first heat sink 520 (the lower side heat sink).

As above, the first heat sink 520 and the second heat sink 530 are thermally connected to the first and second semiconductor chips 511 and 512. The first and second heat sinks 520 and 530 form metal bodies for transferring the heat from the first and second semiconductor chips 511 and 512. In FIG. 20, a lower side surface of the first heat sink 520 forms a first heat radiating surface 521, while an upper side surface of the second heat sink 530 forms a second heat radiating surface 531. Each of the heat radiating surfaces 521 and 531 is exposed to an outside from the molding resin 550 (more exactly, from a sealing portion 551 explained below).

As shown in FIG. 20, according to the heat exchanger of the present embodiment, a part of the molding resin 550 forms the fluid passage 30 for the heating medium. The molding resin 550 is composed of the sealing portion 551, which seals the semiconductor chips 511 and 512 and the heat sinks 520 and 530, and a wall portion 552 formed at a periphery of the sealing portion 551 and having a height larger than a height of the sealing portion 551, so that an upper end as well as a lower end thereof outwardly projects from the heat radiating surfaces 521 and 531, respectively. Each of the upper and lower ends of the wall portion 552 is so formed as to surround the heat radiating surfaces 521 and 531.

A pair of through-holes 553 is formed in the sealing portion 551 between the heat radiating surfaces 521 and 531 of the heat sinks 520 and 530 and the wall portion 552 to form the fluid passages 30 for the heating medium.

As shown in FIG. 19, according to the heat exchanger of the present embodiment, multiple semiconductor package devices 51 are built up. More exactly, the multiple (four in FIG. 19) semiconductor package devices 51 are built up and the respective through-holes 553 are communicated to each other.

A first cover member 60 having an inlet port 61 and an outlet port 62 for the heating medium is attached to one axial side of the built-up semiconductor package device 51, wherein the inlet port 61 and the outlet port 62 are respectively communicated to the through-holes 553. In a similar manner, a second cover member 70 is attached to the other axial side of the built-up semiconductor package device 51 so as to close the through-holes 553. According to the above structure, the heating medium flows into the built-up semiconductor package device 51 via the inlet port 61 and flows out from the built-up semiconductor package device 51 via the outlet port 62.

One axial end of the wall portion 552 (for example, the upper end in FIG. 20) is connected to the other axial end of the wall portion 552 (for example, the lower end in FIG. 20) of the neighboring semiconductor package device 51 to form the built-up device. The first cover member 60 is connected to the one axial end of the wall portion 552 of an uppermost position, while the second cover member 70 is connected to the other axial end of the wall portion 552 of a lowermost position. The respective connections are made by adhesive material (not shown). For example, the first and second cover members 60 and 70 may be made of resin, metal or ceramic material by way of molding, press work and so on.

In the built-up semiconductor package device 51, the heat radiating surface 521 of one device 51 opposes to the heat radiating surface 531 of the other (neighboring) device 51. A space between the opposing heat radiating surfaces 521 and 531 forms a part of the fluid passage 30 for the heating medium. The opposing heating radiating surfaces 521 and 531 as well as the molding resin 550 correspond to a fluid passage forming member.

The inner fin 33 is provided on each of the heat radiating surfaces 521 and 531 so as to divide the fluid passage 30 between the opposing heat radiating surfaces 521 and 531 into multiple small fluid passages and thereby to facilitate the heat exchange between the heating medium and the heat radiating surfaces 521 and 531 of the heat sinks 520 and 530.

The inner fin 33 is formed in the same manner to that of the ninth embodiment (FIG. 11). Namely, the inner fin 33 is composed of one second fin portion 33B and two first fin portions 33A formed at both sides of the second fin portion 33B. The second fin portion 33B is located at such a position facing to the heat radiating surface 521 (531), while the first fin portions 33A are located at such positions not facing to the heat radiating surface 521 (531).

As explained above, the inner fin 33 is composed of the first and second fin portions 33A and 33B, the fin pitches of which are different from each other. Accordingly, it is possible to arrange the inner fin 33 in the entire space of the fluid passage 30 in the width direction, when the length and/or the fin pitch of the first fin portion 33A in the width direction is changed depending on the length of the fluid passage in the width direction. As a result, since it is possible to prevent the heating medium from preferentially passing through only the part of the fluid passage 30, the heat exchange efficiency can be improved.

In addition, according to the present embodiment, the first fin portions 33A having smaller fin pitch than the second fin portion 33B are arranged in the fluid passage 30 at such positions not facing to the heat radiating surface 521 (531). According to such a structure, the pressure loss of the heating medium passing through the fluid passage portions not facing to the heat radiating surfaces 521 and 531 becomes larger, so that the flow amount of the heating medium passing through the fluid passage portions facing to the heat radiating surfaces 521 and 531 becomes larger. As a result, the flow speed of the heating medium is increased and the heat exchange efficiency can be increased as in the same manner to the ninth embodiment.

(Further Modifications)

The embodiments of the present invention are explained as above. However, the present invention should not be limited to those embodiments. The present invention may be modified in various manners, without departing from the spirit of the present invention, for example, as below.

(1) In the above first to thirteenth embodiments, the electronic parts 2 are applied to the physical objects for the heat exchange. However, the physical objects should not be limited thereto. For example, an outer fin may be applied to the physical object, wherein the outer fin is fixed to the outer surface of the fluid pipe 3 in order to increase heat transfer area between the heating medium in the fluid pipe 3 and outer fluid (for example, air) passing through an outside space of the fluid pipe 3.

(2) In the above first to thirteenth embodiments, the fluid pipes 3 are formed in the drawn-cup structure and the flanged portions 300 of the neighboring fluid pipes 3 are connected to each other by soldering, so as to form the connecting members 4 for connecting the multiple fluid pipes 3. As a result, the built-up type heat exchanger 1 is formed. However, the heat exchanger should not be limited to such a type. For example, the present invention may be also applied to a so-called tank-and-tube type heat exchanger, which has multiple fluid tubes (as the fluid passage forming member) and a pair of tanks provided at both sides of the fluid tubes, so that the heating medium flows through the fluid tubes and the heating medium is collected and/or distributed by the tanks.

(3) In the above first to thirteenth embodiments, the heat exchanger 1 has multiple fluid pipes 3. However, the heat exchanger may have one fluid pipe 3.

(4) In the above third embodiment, the inner fin 33 is composed of multiple fins built up in the four layer structure. The inner fin 33 may be composed of multiple fins (more than four fins) built up in a multi-layer structure.

(5) In the above fourteenth embodiment, the inner fins 33 are formed in the three layer structure between the neighboring semiconductor package devices 51. The inner fins may be formed in a multi-layer structure having more than three fins. Furthermore, in the above fourteenth embodiment, the inner fins 33 are formed in the double layer structure between the semiconductor package device 51 and the cover member 60, 70. However, the inner fins may be formed in another multi-layer structure having more than two fins.

(6) In the above eighth embodiment, the first fin portion 33A is formed at one side of the fluid passage 30. However, the first fin portion 33A may be formed at a middle portion of the inner fin 33.

(7) In the above embodiments, the inner fin 33 is composed of the first and second fin portions 33A and 33B, the fin pitch "FP" of which are different from each other. However, the inner fin 33 may be composed of three fin portions, fin pitches "FP" of which are different from one another.

(8) In the above twelfth embodiment, the fin pitch "$FP_{in}$" of the inside inner fin 335 is so made to be almost equal to the fin pitch "FP1" of the first fin portion 33A, which is the smallest in the fin portions of the outside inner fins 334. However, the inside inner fin 335 may be formed in the same shape to that of the outside inner fin 334.

(9) The above embodiments may be combined to each other as much as possible.

What is claimed is:

1. A heat exchanger comprising:
a fluid passage forming member for forming therein a fluid passage through which heating medium passes;
a physical object attached to an outside or an inside of the fluid passage forming member, wherein heat is exchanged between the heating medium and the physical object; and
a plurality of inner fins provided in the fluid passage forming member for dividing the fluid passage into multiple small fluid passages so as to facilitate the heat exchange between the heating medium and the fluid passage forming member,
wherein the plurality of inner fins are built up in a multi-layer structure in an arranging direction for arranging the physical object on the fluid passage forming members,
wherein fluid resistance for the heating medium in the small fluid passages formed by a first inner fin of the plurality of inner fins, which is closer to the physical object than a second inner fin of the plurality of inner fins, is smaller than fluid resistance for the heating medium in the small fluid passages formed by the second inner fin, wherein
each of the inner fins extends in a flow direction of the heating medium,
each of the inner fins has plate portions for dividing the fluid passage into small fluid passages and connecting portions for connecting neighboring plate portions to each other, so that the each of the inner fins is formed in a wave shape in the cross section perpendicular to the flow direction of the heating medium,
each of the inner fins is formed as a wave-type inner fin, so that the plate portions are curved in a wave form in the flow direction of the heating medium, when viewed in the arranging direction, and
a wave depth of the first inner fin, which is closer to the fluid passage forming member than the second inner fin, is smaller than a wave depth of the second inner fin, wherein a wave depth is defined as a dimension of the wave form of the plate portion in an amplitude direction, which is measured in a cross section perpendicular to the arranging direction and crossing centers of the small fluid passages in the arranging direction.

2. The heat exchanger according to the claim 1, wherein each of the inner fins is formed in a wave shape, in a cross section perpendicular to a flow direction of the heating medium, so that projecting portions are alternately projecting in one direction and in the other direction, and a fin pitch of the first inner fin, which is closer to the fluid passage forming member than the second inner fin, is larger than a fin pitch of the second inner fin, wherein the fin pitch is defined as a distance between centers of the neighboring two projecting portions, which are projecting in the same direction of either the one direction or the other direction.

3. The heat exchanger according to the claim 1, wherein each of the inner fins is formed in a wave shape, in a cross section perpendicular to a flow direction of the heating medium, so that projecting portions are alternately projecting in one direction and in the other direction, and a fin height of the first inner fin, which is closer to the fluid passage forming member than the second inner fin, is larger than a fin height of the second inner fin, wherein the fin height is defined as a height of the inner fin in the arranging direction.

4. A heat exchanger comprising:

a fluid passage forming member for forming therein a fluid passage through which heating medium passes;

a physical object attached to an outside or an inside of the fluid passage forming member, wherein heat is exchanged between the heating medium and the physical object; and a plurality of inner fins provided in the fluid passage forming member for dividing the fluid passage into multiple small fluid passages so as to facilitate the heat exchange between the heating medium and the fluid passage forming member, wherein the plurality of inner fins are built up in a multi-layer structure in an arranging direction for arranging the physical object on the fluid passage forming members, wherein fluid resistance for the heating medium in the small fluid passages formed by a first inner fin of the plurality of inner fins, which is closer to the physical object than a second inner fin of the plurality of inner fins, is smaller than fluid resistance for the heating medium in the small fluid passages formed by the second inner fin, wherein each of the inner fins extends in a flow direction of the heating medium, each of the inner fins has plate portions for dividing the fluid passage into small fluid passages and connecting portions for connecting neighboring plate portions to each other, so that each of the inner fins is formed in a wave shape in the cross section perpendicular to the flow direction of the heating medium, each of the inner fins is formed as a wave-type inner fin, so that the plate portions are curved in a wave form in the flow direction of the heating medium, when viewed in the arranging direction, and a wave pitch of the first inner fin, which is closer to the fluid passage forming member than the second inner fin, is larger than a wave pitch of the second inner fin, wherein a wave pitch is defined as a pitch of the wave form of the plate portion, which is measured in a cross section perpendicular to the arranging direction and crossing centers of the small fluid passages in the arranging direction.

5. The heat exchanger according to claim 1, wherein the physical object is composed of an electric part and/or an electronic device.

6. The heat exchanger according to claim 1, wherein the first inner fin is in direct contact with the second inner fin.

7. The heat exchanger according to claim 1, wherein the physical object is distinct from and directly attached to the fluid passage forming member.

8. The heat exchanger according to claim 1, wherein the fluid passage forming member comprises a pair of flat plate members, the plurality of inner fins are in direct contact with the pair of flat plate members and the each of the plurality of inner fins are in direct contact with an adjacent inner fin.

9. The heat exchanger according to claim 1, wherein each of the plurality of inner fins is in direct contact with an adjacent inner fin.

10. The heat exchanger according to claim 1, wherein each of the plurality of inner fins is formed in a wave shape, the heating medium flowing through each of the plurality of inner fins being in direct contact with the heating medium flowing through an adjacent inner fin.

* * * * *